(12) United States Patent
Hirano

(10) Patent No.: US 11,443,806 B2
(45) Date of Patent: Sep. 13, 2022

(54) NONVOLATILE MEMORY AND METHOD OF OPERATING NONVOLATILE MEMORY

(71) Applicant: SAMSUNG ELECTRONICS CO., LTD., Suwon-si (KR)

(72) Inventor: Makoto Hirano, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/215,614

(22) Filed: Mar. 29, 2021

(65) Prior Publication Data

US 2022/0005529 A1    Jan. 6, 2022

(30) Foreign Application Priority Data

Jul. 2, 2020    (KR) ........................ 10-2020-0081675

(51) Int. Cl.
| | | |
|---|---|---|
| G11C 13/00 | (2006.01) |
| G11C 16/08 | (2006.01) |
| G11C 16/24 | (2006.01) |
| G11C 16/26 | (2006.01) |
| G11C 7/14 | (2006.01) |
| G11C 16/04 | (2006.01) |
| G11C 7/02 | (2006.01) |
| G11C 16/10 | (2006.01) |

(52) U.S. Cl.
CPC .............. *G11C 16/08* (2013.01); *G11C 7/02* (2013.01); *G11C 7/14* (2013.01); *G11C 16/0425* (2013.01); *G11C 16/10* (2013.01); *G11C 16/24* (2013.01); *G11C 16/26* (2013.01)

(58) Field of Classification Search
CPC .............. G11C 13/0028; G11C 13/004; G11C 2213/74; G11C 2213/79; G11C 2213/82; G11C 7/02; G11C 7/14; G11C 8/08; G11C 8/10
USPC ........................................................ 365/148
See application file for complete search history.

(56) References Cited

U.S. PATENT DOCUMENTS

| | | |
|---|---|---|
| 9,443,844 B2 | 9/2016 | Takemura |
| 9,747,978 B2 | 8/2017 | Srinivasan et al. |
| 10,102,900 B2 | 10/2018 | Shin |
| 10,269,410 B2 | 4/2019 | Won et al. |
| 10,475,508 B2 | 11/2019 | Mantegazza et al. |
| 10,535,404 B2 | 1/2020 | Castro |
| 2018/0358083 A1 | 12/2018 | Kawamura et al. |
| 2020/0013459 A1 | 1/2020 | Do et al. |
| 2020/0058351 A1 | 2/2020 | Shin |

*Primary Examiner* — Alfredo Bermudez Lozada
(74) *Attorney, Agent, or Firm* — F. Chau & Associates, LLC

(57) ABSTRACT

A nonvolatile memory device includes: a memory cell array in which a plurality of memory cells are arranged at intersections between a plurality of word-lines and a plurality of bit-lines; and a word-line select circuit configured to, in response to a first global word-line select signal, start reading a target memory cell connected to a target word-line and provide a reading result of the target memory cell to a sensing line through at least one adjacent word-line that is adjacent to and coupled to the target word-line.

20 Claims, 22 Drawing Sheets

NONVOLATILE MEMORY AND METHOD OF OPERATING NONVOLATILE MEMORY

CROSS-REFERENCE TO RELATED APPLICATION

This application claims priority under 35 U.S.C. § 119 to Korean Patent Application No. 10-2020-0081675, filed on Jul. 2, 2020 in the Korean Intellectual Property Office, the disclosure of which is incorporated by reference herein in its entirety.

FIELD

The present inventive concept relates to memory devices, and more particularly relates to a nonvolatile memory device and a method of operating the nonvolatile memory device.

DISCUSSION OF RELATED ART

Memory devices are used to store data and may be classified into volatile memory devices and nonvolatile memory devices. As an example of the nonvolatile memory devices, flash memory devices may be used in mobile phones, digital cameras, personal digital assistants (PDAs), mobile computing devices, stationary computing devices, and other devices.

Nonvolatile memory products may be used in many mobile, consumer, and data center applications, for example. NAND flash memory is a widely used type of nonvolatile memory. Other memory technologies may be used besides NAND flash memory according to the related art and result in different power characteristics. For example, phase-change random access memory (PRAM) is a type of nonvolatile memory device that uses a phase-change material as a storage element. Phase-change materials may be considered to be programmable resistive materials capable of easily switching between a high-resistance state and a low-resistance state. Such state switching of phase-change materials may occur according to, for example, temperature changes, and the temperature changes may be caused by resistive heating. Resistive heating may be achieved, for example, by supplying a current between ends of a phase-change material.

SUMMARY

The inventive concept provides a memory device capable of reducing a reading time of a memory cell by reading a program state of a target memory cell through an adjacent word-line while reducing electrical current effects on the target memory cell intended to be read, and a method of operating the memory device.

According to an embodiment of the inventive concept, a nonvolatile memory device includes a memory cell array including a plurality of memory cells arranged at intersections between a plurality of substantially parallel word-lines and a plurality of bit-lines; and a word-line select circuit including a plurality of first transistors each having a first terminal connected to a respective one of the plurality of word-lines, and a plurality of second transistors each having a first terminal connected to the respective one of the plurality of word-lines, wherein each of the plurality of first transistors has a second terminal connected to a pre-select line, and each of the plurality of second transistors has a second terminal connected to a sensing line, wherein at least one of the plurality of first transistors having a first terminal connected to a respective word-line of the plurality of word-lines has a control terminal connected to a control terminal of at least one of the plurality of second transistors having a first terminal connected to an adjacent word-line of the plurality of word-lines, respectively.

According to an embodiment of the inventive concept, a nonvolatile memory device includes: a memory cell array in which a plurality of memory cells are arranged at intersections between a plurality of word-lines and a plurality of bit-lines; and a word-line select circuit configured to, in response to a first global word-line select signal, start reading a target memory cell connected to a target word-line and provide a reading result of the target memory cell to a sensing line through at least one adjacent word-line that is adjacent to and coupled to the target word-line.

According to an embodiment of the inventive concept, a nonvolatile memory device includes: a memory cell array in which a plurality of memory cells are arranged at intersections between a plurality of word-lines and a plurality of bit-lines; and a word-line select circuit configured to, in response to a plurality of global word-line select signals different from each other, determine whether to start reading a target memory cell connected to a target word-line and whether to apply a voltage of the target word-line to a sensing line.

According to an embodiment of the inventive concept, a method of operating a nonvolatile memory device includes: applying a word-line pre-charge voltage to a target word-line in response to a first global word-line select signal and a first local word-line select signal; floating the target word-line in response to a change in a logic state of the first local word-line select signal; applying a bit-line pre-charge voltage to a target bit-line in response to a bit-line select signal; and determining a program state of a target memory cell through at least one adjacent word-line that is adjacent to the target word-line.

BRIEF DESCRIPTION OF THE DRAWINGS

Embodiments of the inventive concept will be more clearly understood from the following detailed description taken in conjunction with the accompanying drawings, in which.

DETAILED DESCRIPTION

Hereinafter, embodiments of the inventive concept will be described in detail with reference to the accompanying drawings.

Figure 1:
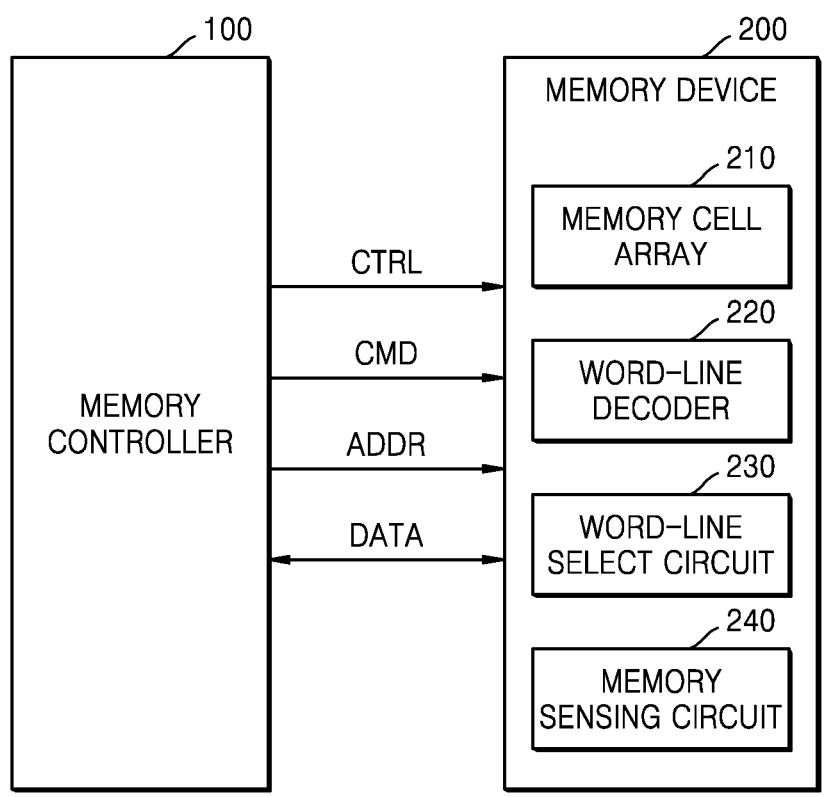
FIG. 1 is a schematic block diagram illustrating a memory system according to an embodiment of the inventive concept.

FIG. 1 illustrates a memory system according to an embodiment of the inventive concept.

Referring to FIG. 1, the memory system may include a memory device 200 and a memory controller 100. The memory device 200 may include a memory cell array 210, a word-line (WL) decoder 220, a word-line select circuit 230, and a memory sensing circuit 240.

The memory controller 100 may control program, read, and erase operations performed on the memory device 200 by providing an address ADDR, a command CMD, and a control signal CTRL to the memory device 200 to read data stored in the memory device 200 or write data to the memory device 200, in response to a read/write request from a host. In addition, data for program operations, and read data may be transmitted and received between the memory controller 100 and the memory device 200.

The memory cell array 210 may include a plurality of memory cells, and the plurality of memory cells may include, for example, resistive memory cells such as resistive RAM (ReRAM) cells, phase-change RAM (PRAM) cells, and/or magnetic RAM (MRAM) cells. The plurality of memory cells of the memory cell array 210 may be at intersections between a plurality of word-lines and a plurality of bit-lines, and a target memory cell may be selected from among the plurality of memory cells, based on a row address transferred from the memory controller 100.

The word-line decoder 220 may select at least one word-line from among the plurality of word-lines in response to the row address, and the word-line select circuit 230 may apply a voltage for instructing the start of reading to a first word-line group by receiving, as an input, a signal corresponding to the row address and may provide a voltage of at least one word-line from among a second word-line group to a sensing line.

The memory sensing circuit 240 may output a signal related to a program state of the target memory cell, based on the voltage provided by the memory cell array 210. According to an embodiment, the memory sensing circuit 240 may output a signal indicating that the target memory cell is an ON-Cell when the provided voltage is equal to or greater than a reference voltage, and may output a signal indicating that the target memory cell is an OFF-Cell when the provided voltage is less than the reference voltage.

Figure 2:
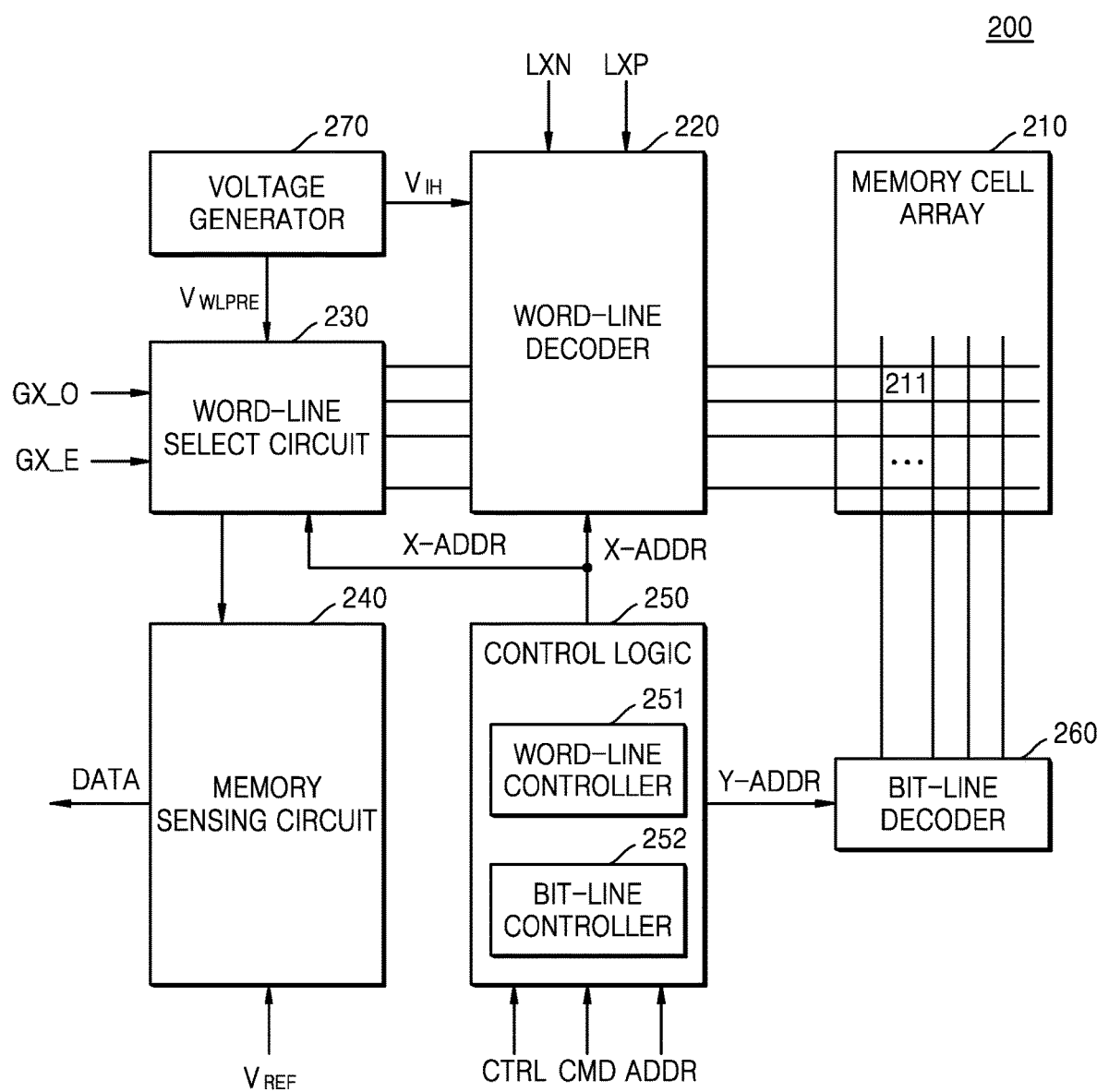
FIG. 2 is a block diagram illustrating a memory device according to an embodiment of the inventive concept.

FIG. 2 illustrates a memory device 200 according to an embodiment of the inventive concept.

Referring to FIG. 2, the memory device 200 may include the memory cell array 210 having a plurality of memory cells 211, the word-line decoder 220, the word-line select circuit 230, the memory sensing circuit 240, control logic 250, a bit-line decoder 260, and a voltage generator 270. The memory cell array 210 according to the present embodiment may be the memory cell array 210 of FIG. 1, without limitation thereto. In particular, the memory cell array 210 according to this embodiment may be connected to the word-line decoder 220 through a plurality of word-lines, string select lines, and ground select lines, and may be connected to the bit-line decoder 260 through bit-lines. Each memory cell 211 may store one or more bits, and in particular, each memory cell may be used as a single-level cell (SLC). Although a memory cell is described hereinafter as being used as a single-level cell for descriptive purposes, the inventive concept is not limited thereto, and the memory cell may be used as a multi-level cell (MLC) or a triple-level cell (TLC), for example.

The control logic 250 may further include a word-line controller 251 and a bit-line controller 252, and may output various control signals for writing data to the memory cell array 210, reading data from the memory cell array 210, or erasing data stored in the memory cell array 210, based on the command CMD, the address ADDR, and the control signal CTRL received from the memory controller 100 of FIG. 1 or the like. Thus, the control logic 250 may take overall control of various operations in the memory device 200. In particular, the word-line controller 251 may determine a row address X-ADDR, based on an address ADDR provided by the memory controller, and the bit-line controller 252 may determine a column address Y-ADDR based on the received address ADDR.

The various control signals output from the control logic 250 may be provided to the word-line select circuit 230, the word-line decoder 220, and the bit-line decoder 260. In particular, the control logic 250 may provide the row address X-ADDR to the word-line decoder 220 and the word-line select circuit 230 and may provide the column address Y-ADDR to the bit-line decoder 260. However, the inventive concept is not limited thereto, and the control logic 250 may further provide other control signals to the word-line decoder 220, the word-line select circuit 230, and the bit-line decoder 260.

For example, the control logic 250 may provide the row address X-ADDR to the word-line select circuit 230 and also provide thereto one of a first global word-line select signal GX_E and a second global word-line select signal GX_O to apply a pre-charge voltage for instructing the start of reading to a word-line corresponding to the row address X-ADDR. In addition, the control logic 250 may provide the row address X-ADDR to the word-line decoder 220, and may concurrently apply a local word-line select signal LXN to one of a target word-line corresponding to the row address X-ADDR and adjacent word-lines and apply a local word-line non-select signal LXP to the other one.

The word-line select circuit 230 may determine which of a first word-line group and a second word-line group a pre-charge voltage VWLPRE is to be applied to, in response to the first global word-line select signal GX_E or the second global word-line select signal GX_O. For example, when the first global word-line select signal GX_E is applied to the word-line select circuit 230, the word-line select circuit 230 may apply the pre-charge voltage VWLPRE received from the voltage generator 270 to the first word-line group. It will be described below in detail with reference to FIGS. 7 to 9 that a plurality of current paths are formed due to a switching operation performed on the first word-line group and the second word-line group in response to the first global word-line select signal GX_E and the second global word-line select signal GX_O.

The word-line decoder 220 may determine word-lines to be activated regarding a connection to the word-line select circuit 230 from among the plurality of word-lines, in response to the local word-line select signal LXN or the local word-line non-select signal LXP.

For example, when the pre-charge voltage VWLPRE is applied to the first word-line group by the first global word-line select signal GX_E being applied to the word-line select circuit 230, and concurrently, when the local word-line select signal LXN is applied to just a target word-line from among the first word-line group and the local word-line non-select signal LXP is applied to the other word-lines, the pre-charge voltage VWLPRE may be transferred to just the target word-line from among the first word-line group. The voltage generator 270 may apply a non-select bias voltage VIH to the other word-lines to which the local word-line non-select signal LXP is applied.

The memory sensing circuit 240 may compare a voltage of the target memory cell received through a sensing line with a reference voltage VREF, and may output a signal DATA related to a program state of the target memory cell based on a comparison result.

Figure 3A:
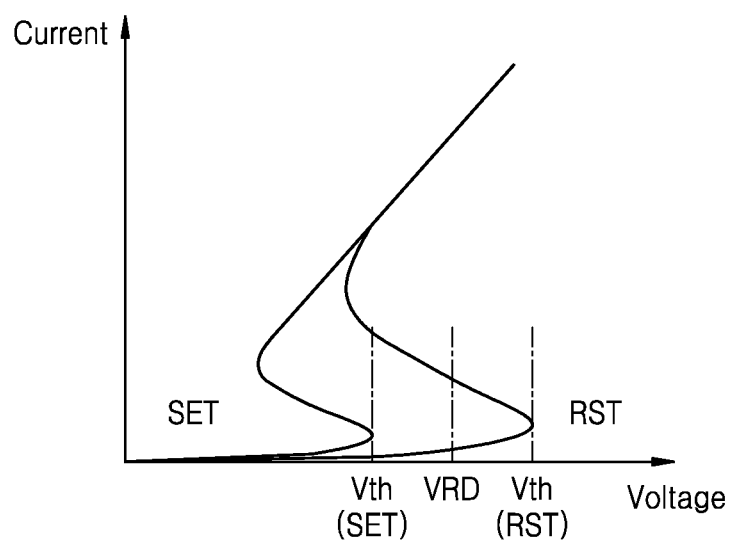
FIG. 3A is a graphical diagram depicting an operation of a memory cell according to an embodiment of the inventive concept.

FIG. 3A is a graph depicting an operation of a memory cell according to an embodiment of the inventive concept.

The memory cell according to an embodiment may include a PRAM device and may have different voltage-current characteristics according to a program state of the memory cell. When a voltage having a level equal to or less than a threshold voltage Vth(SET) is applied to the memory cell while data is set in the memory cell, the magnitude of a current flowing through the memory cell may be extremely small even though the voltage increases. When a voltage greater than the threshold voltage Vth(SET) is applied to the memory cell in which data is set, the current flowing through the memory cell may sharply increase due to an ON state of a switching device such as an ovonic threshold switch (OTS). Accordingly, the memory cell may have a deteriorated lifespan due to the current and may suffer from deterioration due to data retention characteristics that cause a phase change caused by an increase in a temperature of the memory cell.

On the contrary, while data is reset, even when a voltage having a level greater than the threshold voltage Vth(SET) and less than a threshold voltage Vth(RST) is applied to the memory cell, an extremely small current may still flow through the memory cell without causing a phase change. That is, when a voltage between a set threshold voltage level (that is, Vth(SET)) and a reset threshold voltage level (that is, Vth(RST)) is applied as a readout voltage VRD to a memory cell, a memory device may determine whether the corresponding memory cell is an ON-Cell or an OFF-Cell according to the magnitude of a current flowing through the memory cell.

Figure 3B:
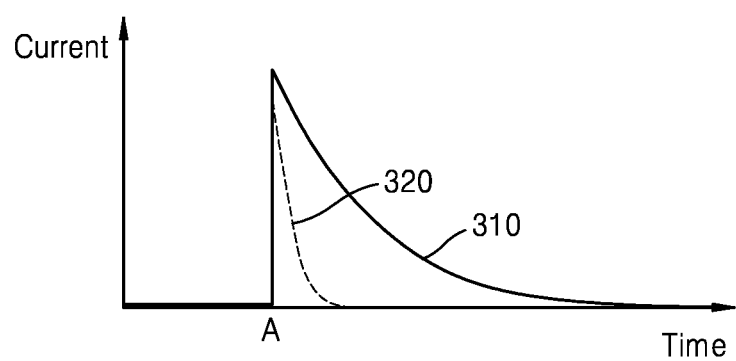
FIG. 3B is a graphical diagram depicting a change over time in a current flowing through a cell when one side of the cell is a floating node according to an embodiment of the inventive concept.

FIG. 3B is a graph depicting a change over time in a current flowing through a cell when one side of the cell is a floating node according to an embodiment of the inventive concept.

Referring to a graph 310 of FIG. 3B, a memory cell is in an ON state at a time point A, and after the elapse of a certain time period, charges of a capacitor connected to the floating node are discharged, whereby the memory cell is in an OFF state. Referring to a graph 320 of FIG. 3B, when a capacitance value of the capacitor connected to the floating node is small, a spike current decreases after the memory cell is in an ON state at the time point A, thereby reducing cell damage.

Figure 4:
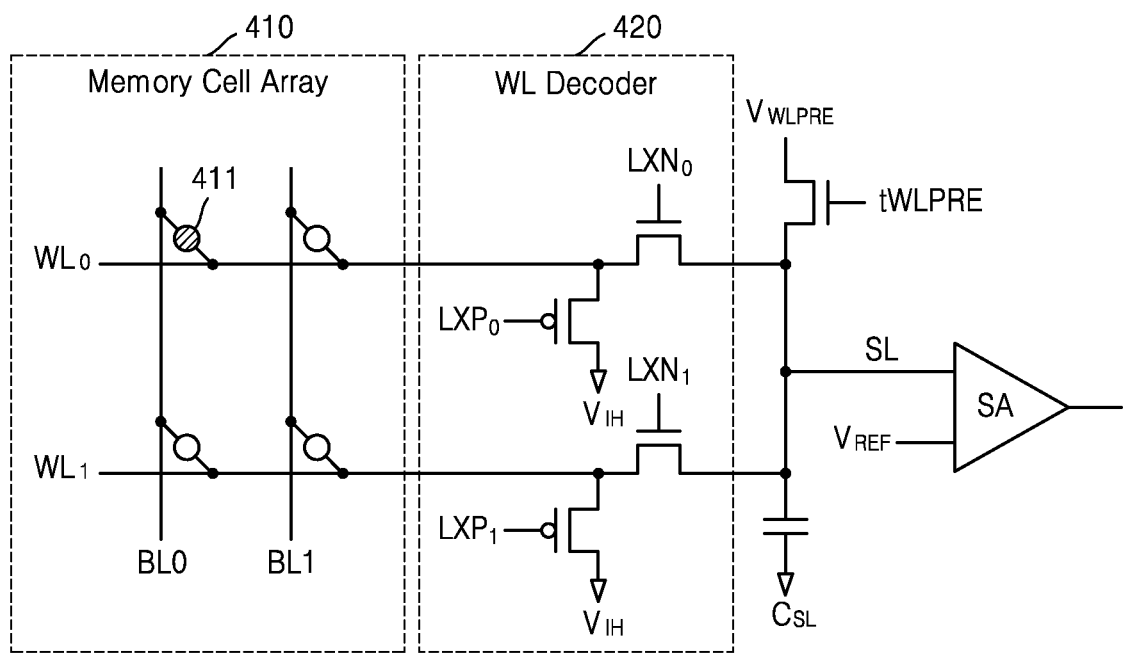
FIG. 4 is a circuit diagram illustrating a configuration of a memory device according to related art.
Figure 5:
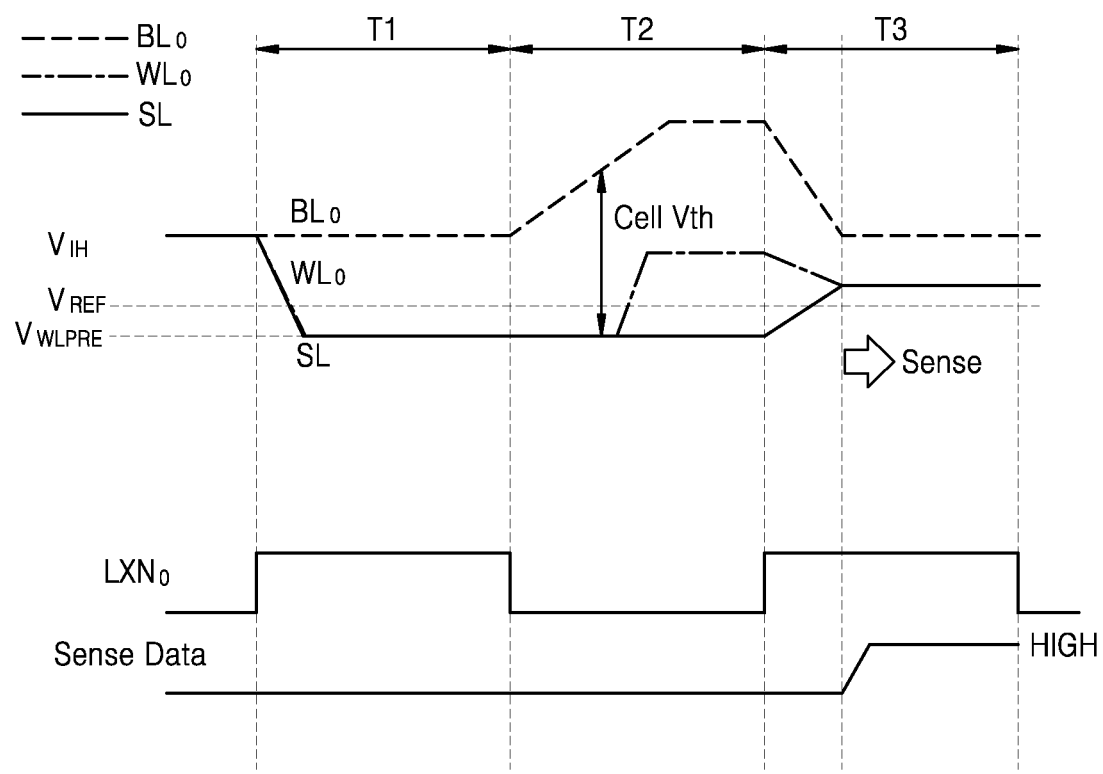
FIG. 5 is a timing diagram illustrating a voltage that is read or applied when the memory cell of FIG. 4 is an ON-Cell.

FIG. 4 illustrates a configuration of a memory device according to the related art, and FIG. 5 illustrates timing of a voltage that is read or applied when the memory cell of FIG. 4 is an ON-Cell.

According to FIGS. 4 and 5, before a first period T1, a word-line decoder 420 may apply the non-select bias voltage VIH to a target word-line WL0 in response to a local word-line non-select signal LXP0. At this time, a local word-line select signal LXN0 may be in a logic-low state, and no voltage may be applied to the target word-line WL0 of a memory cell array 410. The time before the first period T1 refers to the time before a read operation is performed, and before the first period T1, like the non-select bias voltage VIH is applied to the target word-line WL0, the non-select bias voltage VIH may be applied to a target bit-line BL0.

During the first period T1, as the local word-line select signal LXN0 is applied to the word-line decoder 420, the word-line decoder 420 may provide the pre-charge voltage VWLPRE from the voltage generator 270 to the target word-line WL0. At the same time, the pre-charge voltage VWLPRE may also be applied to a sensing line SL. The pre-charge voltage VWLPRE is a voltage for forming a voltage difference between a bit-line and a word-line, and according to an embodiment, the pre-charge voltage VWLPRE may be lower than the non-select bias voltage VIH.

After the pre-charge voltage VWLPRE is formed on the target word-line WL0, during a second period T2, the local word-line select signal LXN0 may transit to logic low, and the target word-line WL0 may be floating, whereby the word-line decoder 420 may cut off a connection between the sensing line SL and the target word-line WL0. When the pre-charge voltage VWLPRE, which is less than the non-select bias voltage VIH, is maintained on the target word-line WL0, and a voltage greater than the non-select bias voltage VIH is applied to the target bit-line BL0, a difference between voltages applied to both ends of the memory cell gradually increases. When a voltage greater than a threshold voltage Vth is applied to both ends of a target memory cell 411 and the target memory cell 411 is an ON-Cell, a current may flow through the target memory cell 411. Accordingly, a voltage of the target word-line WL0, which is disconnected from the sensing line SL, increases.

Afterwards, during a third period T3, as the non-select bias voltage VIH is applied again to the bit-line and the local word-line select signal LXN0 is applied to the word-line decoder 420 corresponding to the target word-line WL0, the connection between the sensing line SL and the target word-line WL0 may be activated. At this time, charge sharing may occur between the sensing line SL and the target word-line WL0, between which there has been a voltage difference, and the sensing line SL and the target word-line WL0 may have a voltage at the same level. During the third period T3, a sensing amplifier SA may compare the voltage of the sensing line SL with a reference voltage VREF, and when the voltage of the sensing line SL is greater than the reference voltage VREF, the memory device may determine that the target memory cell 411 is an ON-Cell.

Figure 6:
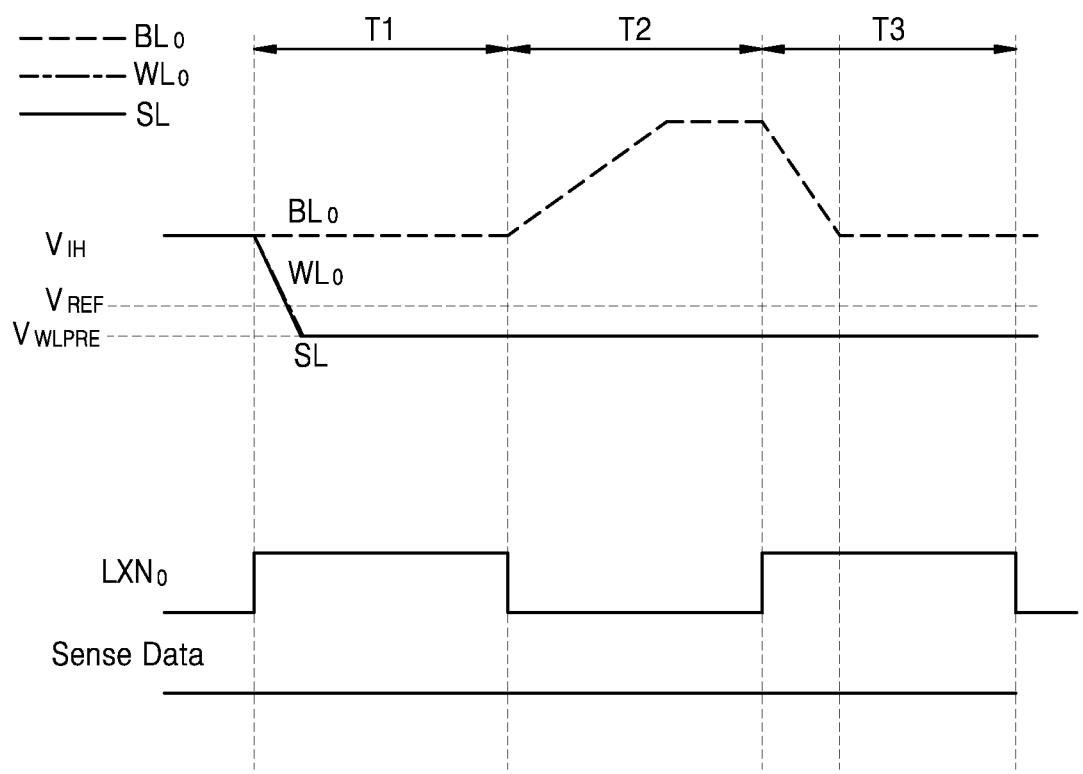
FIG. 6 is a timing diagram illustrating a voltage that is read or applied when the memory cell of FIG. 4 is an OFF-Cell.

FIG. 6 illustrates timing of a voltage that is read or applied when the memory cell of FIG. 4 is an OFF-Cell.

Before and during the first period T1, regarding the target memory cell 411, because voltages output from the target word-line WL0, the target bit-line BL0, and the sensing line SL have been described with reference to FIG. 5, repeated descriptions thereof are omitted.

Referring to FIG. 3A, when the target memory cell 411 is an OFF-Cell, even though the difference between the voltages applied to both ends of the target memory cell 411 is equal to or greater than the threshold voltage VTH, no current may flow through the target memory cell 411. Accordingly, during the second period T2, even when a voltage higher than the non-select bias voltage VIH is applied to the target bit-line BL0 and a voltage difference between the target bit-line BL0 and the target word-line WL0 is equal to or greater than the threshold voltage VTH, the voltage of the target word-line WL0 may be continuously maintained at the pre-charge voltage VWLPRE.

Accordingly, during the third period T3, even when the connection between the sensing line SL and the target word-line WL0 is activated, because both the sensing line SL and the target word-line WL0 are maintained at the pre-charge voltage VWLPRE, the voltage of the sensing line SL may also have no change. In this case, the sensing amplifier SA compares the reference voltage with the voltage of the sensing line SL, and because the voltage of the sensing line SL is lower than the reference voltage, a signal indicating that the target memory cell 411 is an OFF-Cell may be output.

In the memory device according to the related art, which determines a program state of the memory cell as described with reference to FIGS. 4 to 6, a voltage is provided to the target word-line WL0 of the memory cell array 410 or a voltage output from the target memory cell 411 is provided to the sensing line SL according to a signal applied to the word-line decoder 420, and the two operations are not allowed to be concurrently performed by using just one word-line. That is, because divided operation time periods are given to one word-line and different operations regarding a read operation are performed in a divided operation time period, time is unnecessarily consumed in readout.

Figure 7:
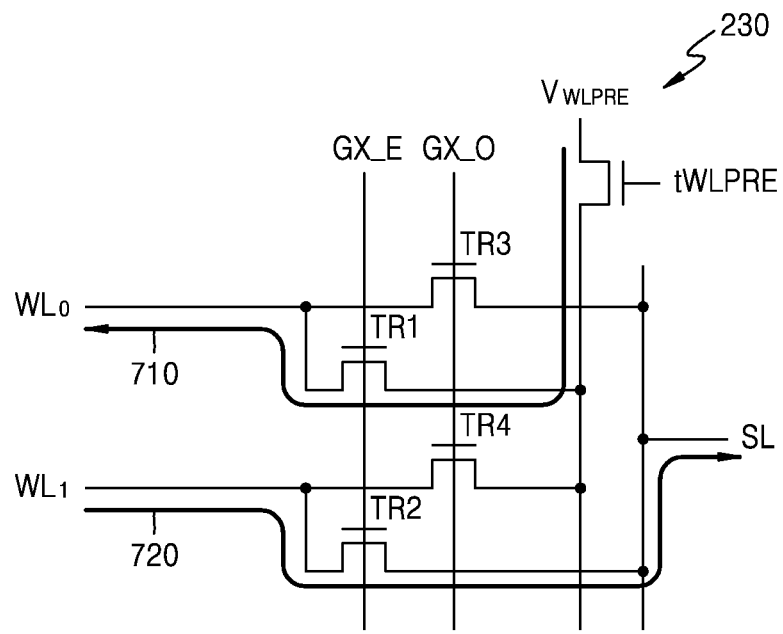
FIG. 7 is a circuit diagram illustrating a configuration and a current path of a word-line select circuit according to an embodiment of the inventive concept.
Figure 8:
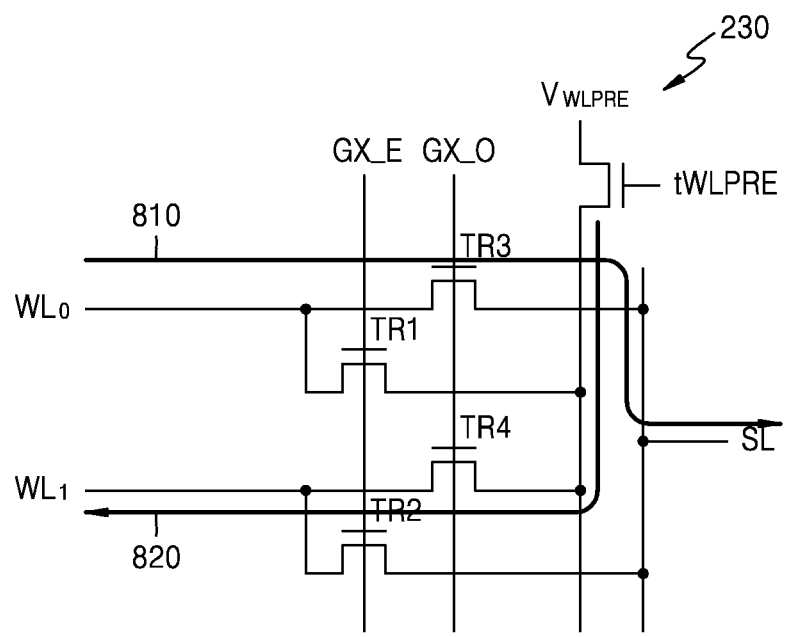
FIG. 8 is a circuit diagram illustrating a configuration and a current path of a word-line select circuit according to an embodiment of the inventive concept.
Figure 9:
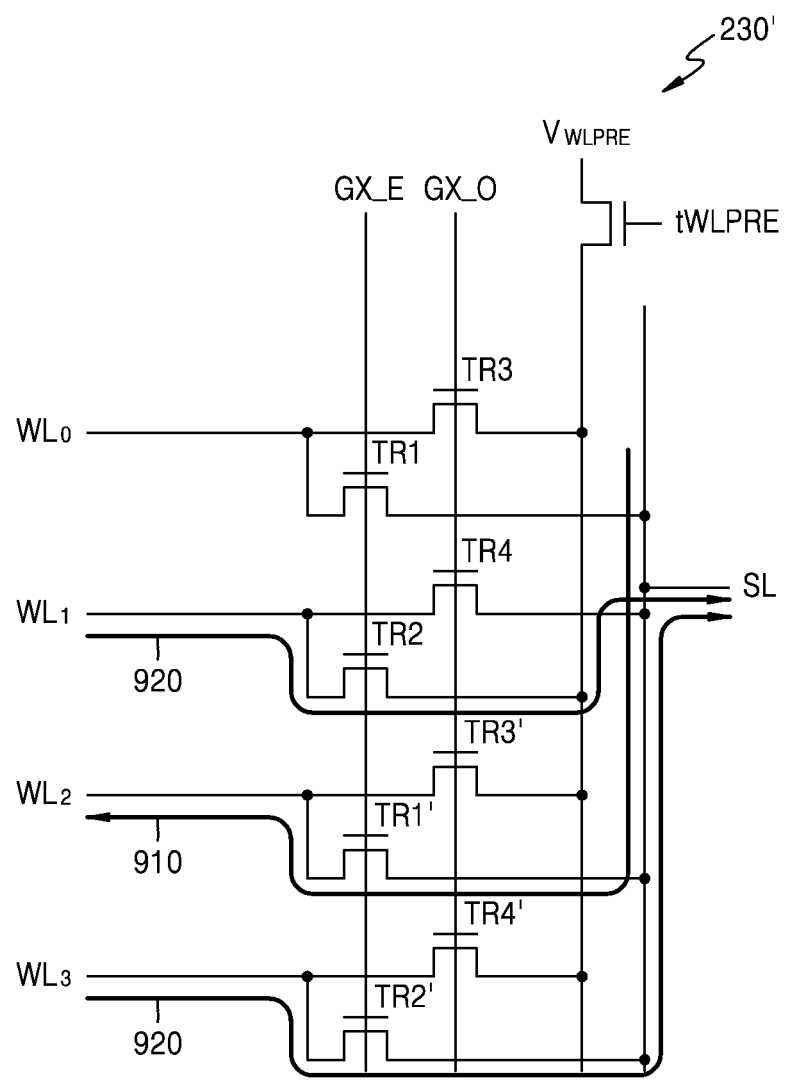
FIG. 9 is a circuit diagram illustrating a configuration and a current path of a word-line select circuit according to an embodiment of the inventive concept.

FIGS. 7 to 9 each illustrate a configuration and a current path of a word-line select circuit according to the inventive concept.

According to an embodiment of the inventive concept, before the pre-charge voltage VWLPRE is applied to the word-line decoder 220, the word-line select circuit may determine whether to apply the pre-charge voltage VWLPRE to the target word-line WL0 or to provide a readout voltage from the target word-line WL0 to the sensing line SL.

FIG. 7 illustrates a word-line select circuit 230 in which, in response to the first global word-line select signal GX_E, the word-line select circuit may provide the pre-charge voltage VWLPRE to a first word-line group WL0 and activate a connection between a second word-line group WL1 and the sensing line SL. Word-lines of the memory cell array 210 may be grouped into a plurality of word-line groups, and as an example, even-numbered word-lines may be grouped into the first word-line group WL0, and odd-numbered word-lines may be grouped into the second word-line group WL1. The first word-line group WL0 and the second word-line group WL1 may be connected in parallel to each of the sensing line SL and a conducting wire to which the pre-charge voltage VWLPRE is applied.

In particular, the first word-line group WL0 may be connected to the conducting wire to which the pre-charge voltage VWLPRE is applied, through a first transistor TR1, and may be connected to the sensing line SL through a third transistor TR3. The second word-line group WL1 may be connected to the sensing line SL through a second transistor TR2 and may be connected to the conducting wire to which the pre-charge voltage VWLPRE is applied, through a fourth transistor TR4. The first transistor TR1 and the second transistor TR2 may be transistors receiving the first global word-line select signal GX_E as a gate signal, and the third transistor TR3 and the fourth transistor TR4 may be transistors receiving the second global word-line select signal GX_O as a gate signal.

When an instruction to read a memory cell connected to the first word-line group WL0 is received from a control logic, the memory select circuit may activate the first transistor TR1, which applies the pre-charge voltage VWLPRE to the first word-line group WL0. By activating the first transistor TR1, the memory device starts reading operation for the first word-line group WL0 and may concurrently activate the second transistor TR2 connecting the second word-line group WL1 to the sensing line SL. That is, in response to the first global word-line select signal GX_E, the word-line select circuit may form a first current path 710, by which the pre-charge voltage VWLPRE is applied to the first word-line group WL0, and a second current path 720, by which a voltage is provided from the second word-line group WL1 to the sensing line SL.

According to various embodiments, FIG. 8 illustrates that, in the word-line select circuit 230, when an instruction to read a memory cell connected to the second word-line group WL1 is received from the control logic, different current paths from the first current path 710 and the second current path 720 of FIG. 7 are formed.

When an instruction to read a memory cell connected to the second word-line group WL1 is received from the control logic, the memory select circuit may activate the fourth transistor TR4, which applies the pre-charge voltage VWLPRE to the second word-line group WL1. By activating the fourth transistor TR4, the memory device starts reading operation for the second word-line group WL1 and may concurrently activate the third transistor TR3 connecting the first word-line group WL0 to the sensing line SL. That is, in response to the second global word-line select signal GX_O, the word-line select circuit may form a third current path 810, by which a voltage is provided from the first word-line group WL0 to the sensing line SL, and a fourth current path 820, by which the pre-charge voltage VWLPRE is applied to the second word-line group WL1.

According to the embodiment of FIG. 9 in a word-line select circuit 230', by using a second word-line WL2 as a target word-line, to read a target memory cell connected to the target word-line WL2, voltages of word-lines WL1 and WL3 adjacent to the target word-line WL2 may be provided to the sensing line SL. That is, a first current path 910, by which the pre-charge voltage VWLPRE is applied to the target word-line WL2, may be formed by inputting the first global word-line select signal GX_E to a gate of another first transistor TR1', and concurrently, a plurality of second current paths 920, by which a sum of the voltages of the adjacent word-lines WL1 and WL3 is provided to the sensing line SL, may be formed by inputting the first global word-line select signal GX_E to a gate of the second transistor TR2 and a gate of another second transistor TR2' of each of the adjacent word-lines WL1 and WL3, respectively.

Figure 10:
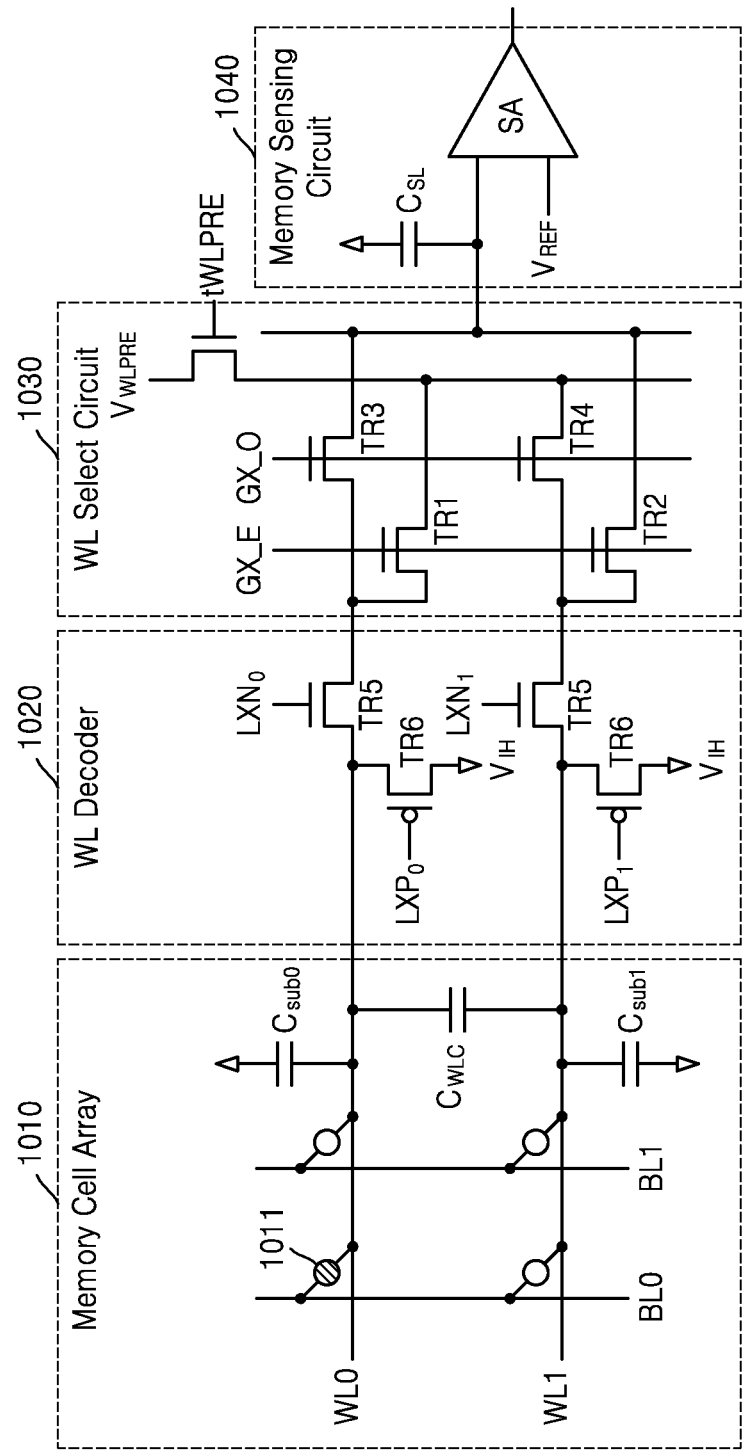
FIG. 10 is a circuit diagram illustrating a configuration of a memory device according to an embodiment of the inventive concept.

FIG. 10 illustrates a configuration of a memory device according to an embodiment of the inventive concept.

The memory device according to the embodiment of FIG. 10 may be a memory device including a word-line select circuit 1030 as described with reference to FIGS. 7 and 8. Although two word-lines and two bit-lines are illustrated for convenience of description, a memory cell array 1010 of the memory device may include a plurality of word-lines and a plurality of bit-lines, and the respective numbers of bit-lines, word-lines, and memory cells are not limited to the embodiment of FIG. 10.

The memory cell array 1010 may include a plurality of word-lines, and because the plurality of word-lines each include a metal conducting wire, a parasitic capacitance may be formed between adjacent word-lines. That is, a voltage applied to or read from the target word-line WL0 may affect at least one word-line adjacent to the target word-line WL0. In the circuit according to the embodiment of FIG. 10, although a parasitic capacitor CWLC is illustrated between word-lines, this is for illustrating the generation of a certain voltage in an adjacent word-line WL1 due to the voltage of the target word-line WL0, and actually, there is no physical or discrete capacitor between the word-lines. Accordingly, when a target memory cell 1011 is an ON-Cell, a voltage is formed in the target word-line WL0 during the process of reading, and a certain voltage may also be generated in at least one adjacent word-line WL1 that is coupled to the target word-line WL0.

In response to one of a local word-line select signal LXN and a local word-line non-select signal LXP, which are independently applied to the target word-line WL0 and the adjacent word-line WL1, a word-line decoder 1020 may determine whether to connect the target word-line WL0 and the adjacent word-line WL1 to the word-line select circuit 1030. For example, when a local word-line select signal LXN0 is applied to a gate of a fifth transistor TR5 of the target word-line WL0, the word-line decoder 1020 may activate a connection between a word-line of the memory cell array 1010 and the word-line select circuit 1030. On the contrary, when a local word-line non-select signal LXP0 is applied to a gate of a sixth transistor TR6 of the target word-line WL0, the word-line decoder 1020 may apply the non-select bias voltage VIH to the target word-line WL0.

The word-line select circuit 1030 may receive one of the first global word-line select signal GX_E and the second global word-line select signal GX_O according to which of the first word-line group and the second word-line group the target word-line WL0 belongs to. Because operations of the word-line select circuit 1030 have been described in detail with reference to FIGS. 7 to 9, repeated descriptions thereof are omitted.

A memory sensing circuit 1040 may output a signal indicating a program state of the target memory cell 1011, based on a result of a comparison between the voltage of the sensing line SL and the reference voltage VREF. The voltage of the sensing line SL may be formed as a voltage generated due to charge sharing with the at least one adjacent word-line WL1. When the voltage of the sensing line SL is equal to or greater than the reference voltage VREF, the memory sensing circuit 1040 may output a signal indicating that the target memory cell 1011 is in a state in which data is written thereto, and when the voltage of the sensing line SL is less than the reference voltage VREF, the memory sensing circuit 1040 may output a signal indicating that the target memory cell 1011 is in a state in which data is not written thereto.

Figure 11:
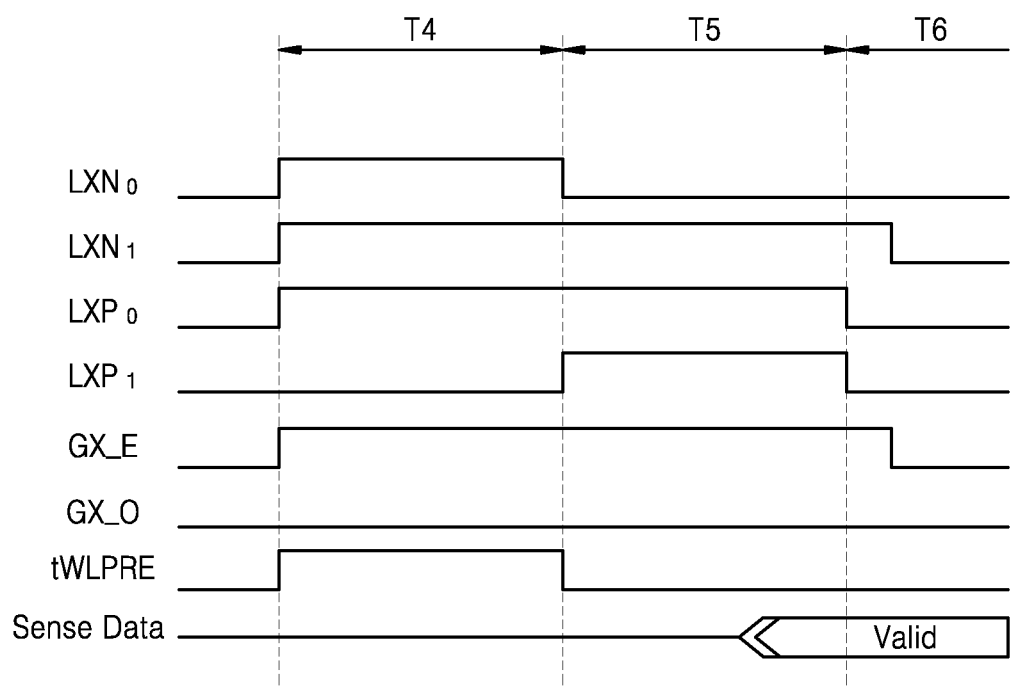
FIG. 11 is a timing diagram illustrating a readout instruction voltage of a memory device according to an embodiment of the inventive concept.
Figure 12:
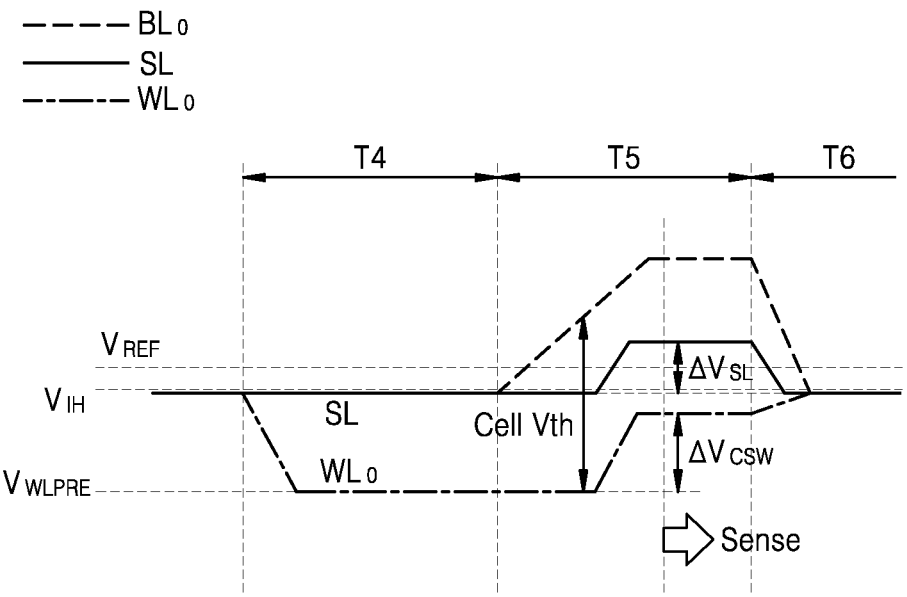
FIG. 12 is a timing diagram illustrating a voltage that is read from a target memory cell when the target memory cell is an ON-Cell according to an embodiment of the inventive concept.

FIG. 11 illustrates a readout instruction voltage that is input to a memory device according to an embodiment of the inventive concept, and FIG. 12 illustrates a voltage that is read from the target memory cell 1011 when the target memory cell 1011 is an ON-Cell according to an embodiment of the inventive concept.

Before a fourth period T4, a pre-charge instruction signal tWLPRE, the local word-line select signal LXN, the local word-line non-select signal LXP, and the first and second global word-line select signals GX_E and GX_O, which are in logic-low states, may be applied to the word-line decoder 1020 and the word-line select circuit 1030. Referring together to FIGS. 10 and 11, the sixth transistor TR6, to which the local word-line non-select signal LXP is input, may be a PMOS transistor, and because the sixth transistor TR6 is activated when logic low is input thereto, the non-select voltage VIH may be applied to the target word-line WL0 and the adjacent word-line WL1.

During the fourth period T4, regarding the signals LXN0, LXP0, GX_E, and GX_O applied to the word-line decoder 1020, which is connected to the target word-line WL0, and the word-line select circuit 1030, because the local word-line select signal LXN0 in logic high is input to the fifth transistor TR5 of the target word-line WL0 and the local word-line non-select signal LXP0 in logic high is input to the sixth transistor TR6 of the target word-line WL0, the non-select bias voltage VIH may not be applied to the target word-line WL0. As a result, memory device may activate a connection between the target word-line WL0 and the word-line select circuit 1030. Because the first global word-line select signal GX_E applied to the first transistor TR1 of the word-line select circuit 1030, the second global word-line select signal GX_O applied to the third transistor TR3 thereof, and the pre-charge instruction signal tWLPRE are in logic high, logic low, and logic high, respectively, the memory device may form the first current path 710 by which the pre-charge voltage VWLPRE is applied to the target word-line WL0. Accordingly, according to FIG. 12, during the fourth period T4, the target word-line WL0 may have a level of the pre-charge voltage VWLPRE.

During the fourth period T4, regarding the signals LXN1, LXP1, GX_E, and GX_O applied to the word-line decoder 1020, which is connected to the adjacent word-line WL1, and the word-line select circuit 1030, the local word-line select signal LXN1 in logic high may be input to the fifth transistor TR5 of the adjacent word-line WL1, and the local word-line non-select signal LXP1 in logic low may be input to the sixth transistor TR6 of the adjacent word-line WL1. Accordingly, because the connection between the adjacent word-line WL1 of the memory cell array 1010 and the word-line select circuit 1030 is activated and the sixth transistor TR is also activated, the adjacent word-line WL1 may have the non-select bias voltage VIH. Because the first global word-line select signal GX_E applied to the first transistor TR1 of the word-line select circuit 1030 is in logic high and the second global word-line select signal GX_O applied to the third transistor TR3 thereof is in logic low, the word-line select circuit 1030 may form the second current path 720 by which the connection between the adjacent word-line WL1 and the sensing line SL is activated. Accordingly, according to FIG. 12, during the fourth period T4, the adjacent word-line WL1 and the sensing line SL may have a level of the non-select bias voltage VIH.

During a fifth period T5, regarding the signals LXN0, LXP0, GX_E, and GX_O applied to the word-line decoder 1020, which is connected to the target word-line WL0, and the word-line select circuit 1030, the local word-line select signal LXN0 applied to the fifth transistor TR5 transits to logic low. Accordingly, the connection between the target word-line WL0 and the word-line select circuit 1030 is inactivated, and thus, the target word-line WL0 is floating and may be maintained at the level of the pre-charge voltage VWLPRE due to a capacitor connected to the target word-line WL0.

During the fifth period T5, regarding the signals LXN1, LXP1, GX_E, and GX_O applied to the word-line decoder 1020, which is connected to the adjacent word-line WL1, and the word-line select circuit 1030, the local word-line non-select signal LXP1 applied to the sixth transistor TR6 of the adjacent word-line WL1 transits to logic high. Accordingly, the non-select bias voltage VIH is not applied to the adjacent word-line WL1. Because the local word-line select signal LXN1 applied to the fifth transistor TR5 of the adjacent word-line WL1 is maintained in logic high, the connection between the adjacent word-line WL1 and the sensing line SL may be maintained.

According to FIG. 12, while the target word-line WL0 is floating and thus maintained at the pre-charge voltage VWLPRE less than the non-select bias voltage VIH, when a voltage greater than the non-select bias voltage VIH is applied to a target bit-line, a difference between voltages applied to both ends of the target memory cell 1011 gradually increases. When voltages greater than a level of the threshold voltage Vth are applied to both ends of the target memory cell 1011 and the target memory cell 1011 is an ON-Cell, a current may flow through the target memory cell 1011. Accordingly, the voltage of the target word-line WL0 may increase, and the voltage of the at least one adjacent word-line WL1 coupled to the target word-line WL0 may also increase. As described above, during the fifth period T5, because the connection between the adjacent word-line WL1 and the sensing line SL is maintained, the voltage of the sensing line SL may also increase.

According to an embodiment, a voltage change ΔVSL of the sensing line SL may be determined by capacitors connected to a word-line and the sensing line SL and a parasitic capacitor. The voltage change ΔVSL of the sensing line SL may be proportional to a voltage change ΔVCSW of a target word-line and a parasitic capacitance CWLC and may be inversely proportional to a capacitance Csub connected to the word-line and a capacitance CSL connected to the sensing line SL. That is, a relationship between the voltage change of the sensing line SL and the voltage change of the target word-line may be represented by the following Equation 1.

$$\Delta V_{SL} = \Delta V_{CSW} \times \frac{C_{WLC}}{C_{sub} + C_{SL}} \quad \text{[Equation 1]}$$

During the fifth period T5, after a maximum voltage is applied to the target bit-line, the memory sensing circuit 1040 may determine the program state of the target memory cell 1011 by comparing the reference voltage VREF with the voltage of the sensing line SL. According to FIG. 12, because the voltage of the sensing line SL is higher than the reference voltage VREF, it may be determined that the target memory cell 1011 is an ON-Cell.

During a sixth period T6, as the local word-line non-select signals LXP0 and LXP1 respectively applied to the sixth transistors TR6 of the target word-line WL0 and the adjacent word-line WL1 transit to logic low, the target word-line WL0 and the adjacent word-line WL1 have the level of the non-select bias voltage. Afterwards, as the local word-line select signal LXN1 applied to the fifth transistor TR5 of the adjacent word-line WL1 transits to logic low, the connection between the adjacent word-line WL1 and the sensing line SL may be inactivated. In addition, as the first global word-line select signal GX_E also transits to logic low, the first current path 710 and the second current path 720 are also inactivated, and thus, one cycle of a read operation may be terminated.

According to a method of operating a memory device, in accordance with an embodiment of the inventive concept, a readout state of a target memory cell is detected through an adjacent word-line, and the method according to the inventive concept may provide a high reading speed by forming a plurality of current paths by which both a readout instruction and a voltage readout are performed through one current path. Comparing FIG. 5 illustrating timing of a read operation according to related art with FIG. 12 illustrating timing of a read operation according to the inventive concept, although the readout state of the target memory cell is determined during the third period T3 in the reading method according to the related art, because the readout state of the target memory cell is determined during the fifth period T5 in the reading method according to the inventive concept, the memory device according to the inventive concept may read the target memory cell faster than that according to the related art.

Figure 13:
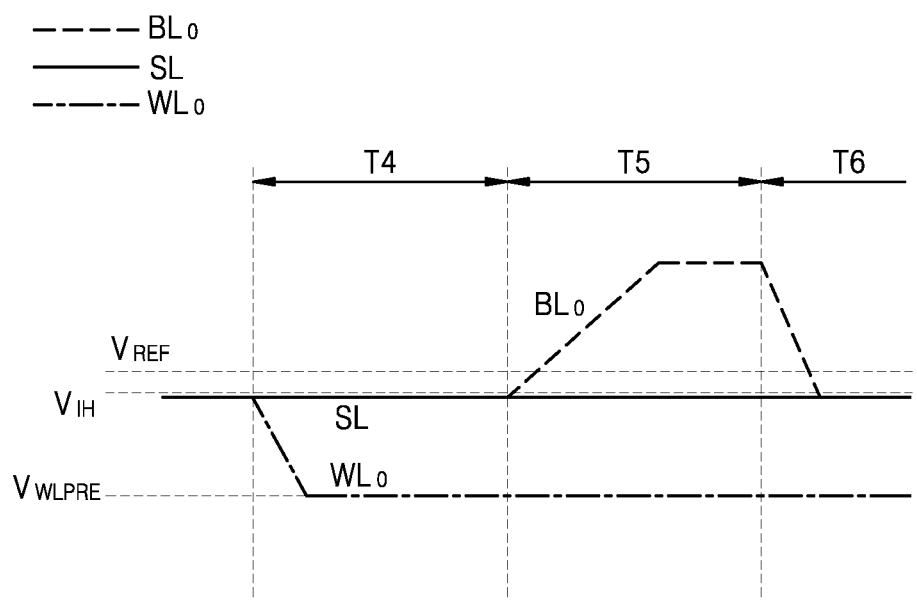
FIG. 13 is a timing diagram illustrating a voltage that is read from a target memory cell when the target memory cell is an OFF-Cell according to an embodiment of the inventive concept.

FIG. 13 illustrates a voltage that is read from a target memory cell when the target memory cell according to the embodiment of FIG. 10 is an OFF-Cell.

Before and during the fourth period T4, because, regarding the target memory cell 1011, voltages output from a target word-line, a target bit-line, and the sensing line SL have been described with reference to FIG. 12, repeated descriptions thereof are omitted.

According to FIG. 3A, when the target memory cell 1011 is an OFF-Cell, no current may flow through the target memory cell 1011 even though a difference between the voltages applied to both ends of the target memory cell 1011 is equal to or greater than the threshold voltage VTH. Accordingly, during the fifth period T5, even when a voltage higher than the non-select bias voltage VIH is applied to the target bit-line BL0 and a voltage difference between the target bit-line BL0 and the target word-line WL0 is equal to or greater than the non-select bias voltage VIH, the voltage of the target word-line WL0 may be continuously maintained at the pre-charge voltage VWLPRE.

Therefore, during the sixth period T6, even when the connection between the sensing line SL and the adjacent word-line WL1 is activated, the adjacent word-line WL1 is maintained at the non-select bias voltage VIH, and thus, the voltage of the sensing line SL may also have no change. In this case, a memory sensing circuit compares the reference voltage VREF with the voltage of the sensing line SL, and because the voltage of the sensing line SL is lower than the reference voltage VREF as a result of the comparison, it may be determined that the target memory cell 1011 is an OFF-Cell.

Figure 14:
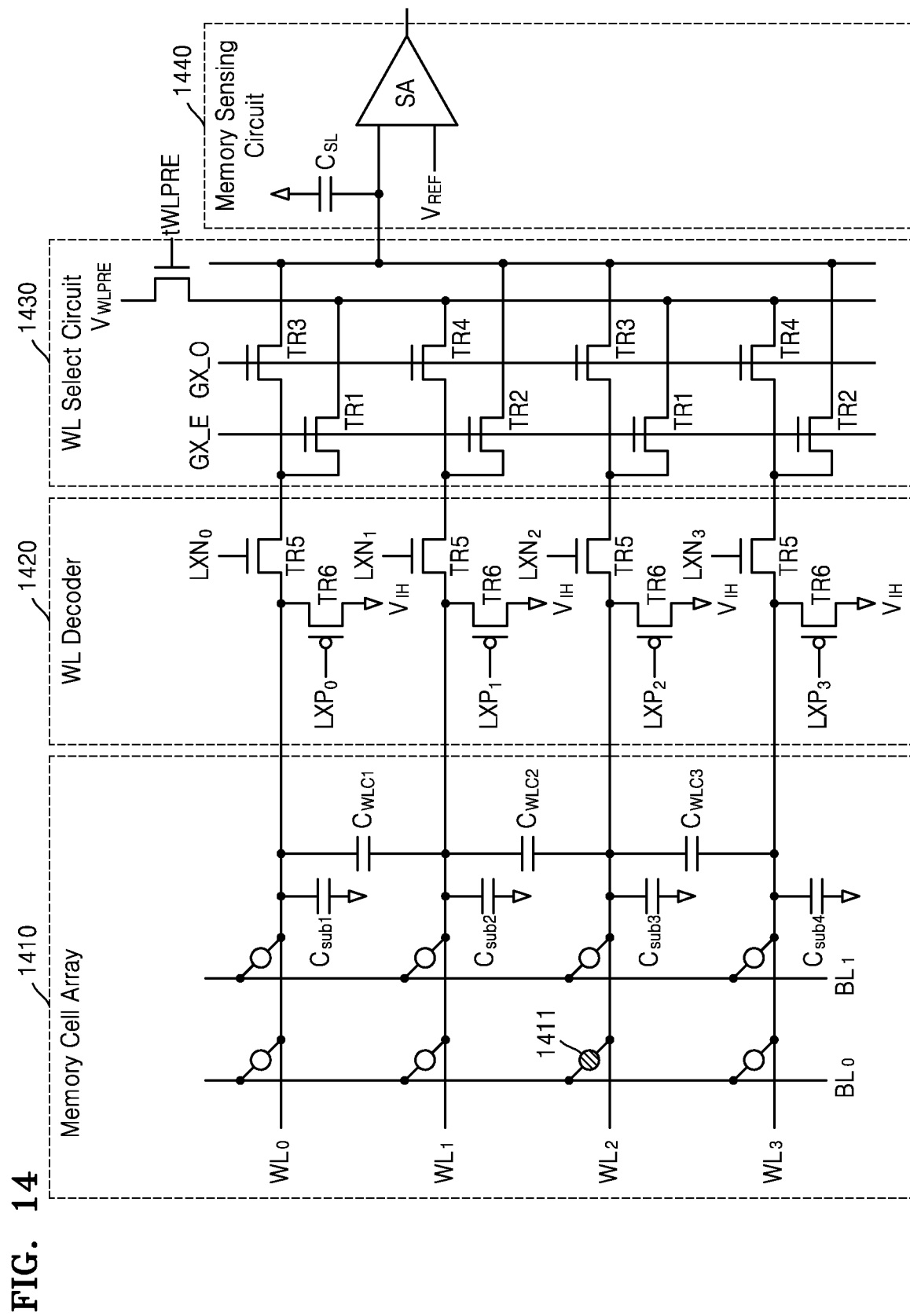
FIG. 14 is a circuit diagram illustrating that reading a target memory cell is performed through a plurality of adjacent word-lines according to an embodiment of the inventive concept.

FIG. 14 illustrates that reading a target memory cell 1411 is performed through a plurality of adjacent word-lines WL1 and WL3 according to an embodiment of the inventive concept.

A memory device according to the embodiment of FIG. 14 may be a memory device including a word-line select circuit 1430 identical to that of FIG. 9, and although FIG. 14, which illustrates that a reading result of the target memory cell 1411 is provided to a memory sensing circuit 1440 through the plurality of adjacent word-lines WL1 and WL3, illustrates four word-lines for convenience of description, the respective numbers of word-lines, bit-lines, and memory cells are not limited to the embodiment of FIG. 14.

A memory cell array 1410 may include a plurality of word-lines, and because the plurality of word-lines each include a metal conducting wire, a parasitic capacitance may be formed between adjacent word-lines. That is, a voltage applied to or read from a target word-line WL2 may affect the plurality of adjacent word-lines WL1 and WL3 adjacent to the target word-line WL2. A relationship between the voltage formed in the target word-line WL2 and the voltages formed in the plurality of adjacent word-lines WL1 and WL3 may be determined based on capacitances of parasitic capacitors CWLC2 and CWLC3 between the word-lines and based on capacitances of capacitors Csub2 and Csub4 connected to the respective word-lines and the sensing line SL, and this has been described with reference to FIG. 12, repeated descriptions thereof are omitted.

The plurality of word-lines may be classified into a first word-line group (WL0 and WL2) and a second word-line group (WL1 and WL3), and the word-line select circuit 1430 connected to the first word-line group (WL0 and WL2) may perform the same operation by receiving a global word-line select signal. For example, when a first global word-line select signal is applied to the word-line select circuit 1430 connected to the first word-line group (WL0 and WL2), the word-line select circuit 1430 may form a current path, by which the pre-charge voltage VWLPRE is input to the first word-line group (WL0 and WL2), by activating the first transistor TR1. In addition, when the first global word-line select signal GX_E is applied to the word-line select circuit 1430 connected to the second word-line group (WL1 and WL3), the word-line select circuit 1430 may form a current path, by which the connection between the second word-line WL2 and the sensing line SL is activated, by activating the second transistor TR2.

Figure 15:
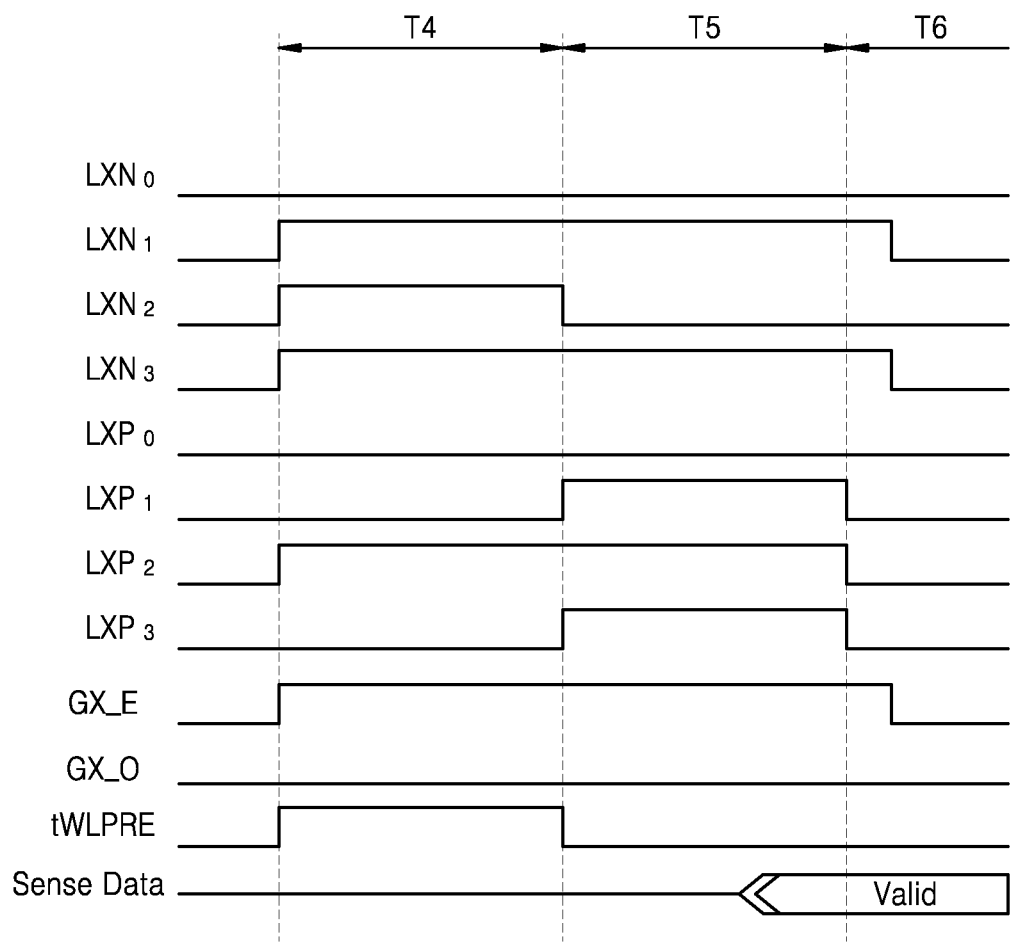
FIG. 15 is a timing diagram illustrating a readout instruction voltage of a memory device according to an embodiment of the inventive concept.

FIG. 15 illustrates a readout instruction voltage of a memory device according to an embodiment of the inventive concept.

According to FIG. 15, to read the target memory cell 1411 connected to the second word-line WL2 from among the first word-line group (WL0 and WL2), a plurality of signals may be applied to the word-line decoder 1420 and the word-line select circuit 1430. The memory device may apply the first global word-line select signal GX_E in logic high to the word-line select circuit 1430 to instruct a read operation for the first word-line group (WL0 and WL2) and may connect the second word-line WL2 to the word-line select circuit 1430 by applying the local word-line select signal LXN2 in logic high to the second word-line WL2 from among the first word-line group (WL0 and WL2). Because the read operation is not performed on the zeroth word-line WL0 from among the first word-line group (WL0 and WL2), the local word-line select signal LXN0 may not be applied to the zeroth word-line WL0.

The first word-line WL1 and the third word-line WL3, which are adjacent word-lines of the second word-line WL2, are some word-lines from among the second word-line group, and the memory device may apply a signal for activating a connection of the sensing line SL to the first word-line WL1 and the third word-line WL3 to the word-line decoder 1420 and the word-line select circuit 1430.

Referring to the timing of FIG. 15, as there are two adjacent word-lines WL1 and WL3, which are increased in number as compared with the embodiment where a readout voltage is transferred to the sensing line SL by using one adjacent word-line according to the timing of FIG. 11, the same signal may be repeatedly input to the respective word-line decoders 1420 of the first word-line WL1 and the third word-line WL3.

Because the signals applied to the target word-line and one adjacent word-line during the fourth period T4, the fifth period T5, and the sixth period T6 have been described with reference to FIG. 11, descriptions of the embodiment of FIG. 15, in which a signal applied to one adjacent word-line is repeatedly applied to a plurality of word-lines, are omitted.

Figure 16:
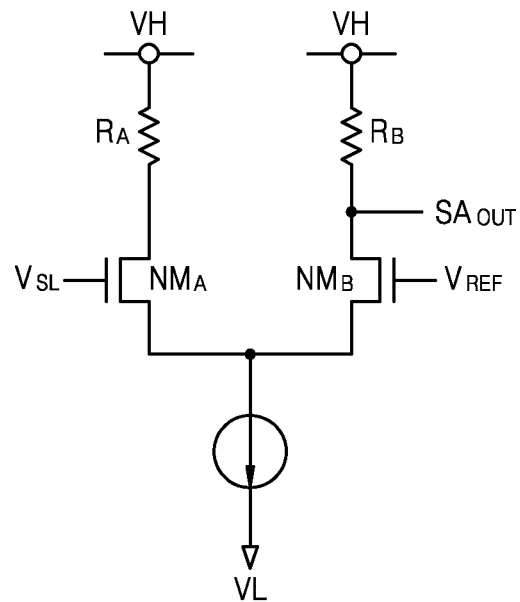
FIG. 16 is a circuit diagram illustrating a configuration of a sensing amplifier according to an embodiment of the inventive concept.

FIG. 16 illustrates a configuration of a sensing amplifier according to an embodiment of the inventive concept.

According to FIG. 16, a sensing line voltage VSL and the reference voltage VREF may be input to a sensing amplifier of a memory sensing circuit, and the sensing amplifier may provide a comparison result SAOUT by comparing the sensing line voltage VSL with the reference voltage VREF. For example, when the sensing line voltage VSL is higher than the reference voltage VREF, the sensing amplifier may provide a comparison result in logic high, the comparison result in logic high may be input to a control logic, and thus, the control logic may determine that data has been written to a target memory cell.

Here, the sensing amplifier may provide the comparison result by using a plurality of resistors RA and RB and a plurality of transistors NMA and NMB, and there may be mismatches between the plurality of resistors RA and RB and the plurality of transistors NMA and NMB due to processes. When there is a mismatch in an internal element of the sensing amplifier, the sensing amplifier may provide the comparison result SAOUT by comparing the sensing line voltage VSL with a voltage shifted from the input reference voltage VREF by as much as a certain offset.

Figure 17:
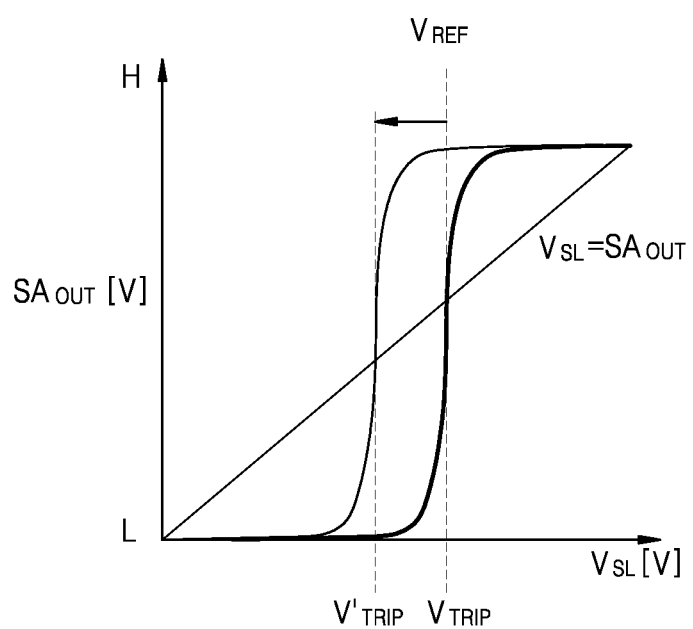
FIG. 17 is a graph depicting a change in a detection voltage due to an offset of a sensing amplifier according to an embodiment of the inventive concept.

FIG. 17 is a graph depicting a change in a detection voltage due to an offset of a sensing amplifier according to an embodiment of the inventive concept.

A sensing amplifier according to an embodiment, by using the reference voltage VREF as a detection voltage VTRIP, may produce the comparison result SAOUT in logic low when the sensing line voltage VSL is less than the detection voltage VTRIP, and may produce the comparison result SAOUT in logic high when the sensing line voltage VSL is greater than the detection voltage VTRIP. On the contrary, when there is a mismatch in a configuration of a sensing amplifier, even though the reference voltage VREF is applied to the sensing amplifier, the sensing amplifier may produce the comparison result SAOUT based on a shifted detection voltage V'TRIP that is shifted from the reference voltage VREF by as much as a certain offset. The sensing amplifier having a mismatch may produce the comparison result SAOUT in logic high when the sensing line voltage VSL is greater than the shifted detection voltage V'TRIP, and may produce the comparison result SAOUT in logic low when the sensing line voltage VSL is less than the shifted detection voltage V'TRIP. That is, when the sensing line voltage VSL has a voltage level between the shifted detection voltage V'TRIP and the detection voltage VTRIP, an output result (SAOUT) of the sensing amplifier having a mismatch with the sensing amplifier may vary. Accordingly, to accurately read a program state of a target memory cell, it may be significant to compensate for an offset of the sensing amplifier having a mismatch.

Figure 18:
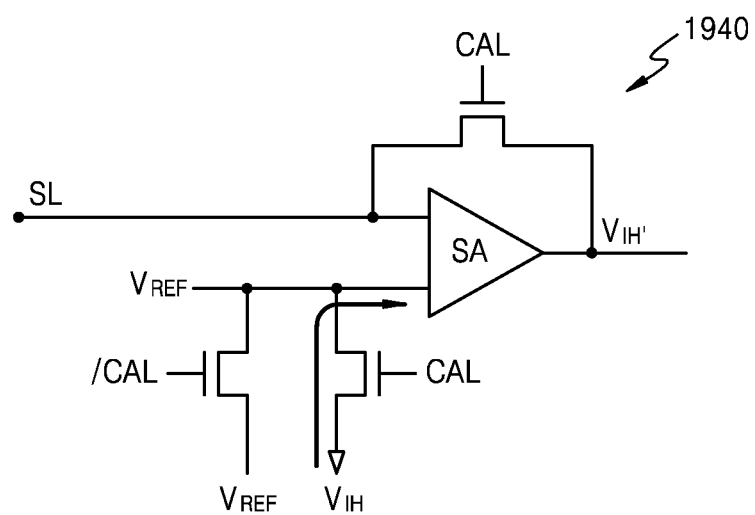
FIG. 18 is a circuit diagram illustrating a configuration of a memory sensing circuit according to another embodiment of the inventive concept.

FIG. 18 illustrates a configuration of a memory sensing circuit 1940 according to an embodiment of the inventive concept.

According to an embodiment, a sensing amplifier SA of a memory sensing circuit may receive two voltages that are input thereto, a first input stage of the sensing amplifier SA may be connected to the sensing line SL and thus receive a sensing line voltage, and a second input stage of the sensing amplifier SA may receive one of the reference voltage VREF and the non-select bias voltage VIH according to a calibration instruction signal CAL. The second input stage of the sensing amplifier SA may receive the non-select bias voltage VIH applied thereto in response to the calibration instruction signal CAL, and here, an inverse calibration instruction signal /CAL, which is inverse to the calibration instruction signal CAL, may inactivate a transistor supplying the reference voltage VREF. The inverse calibration instruction signal /CAL is a signal having a logic state that is inverse to that of the calibration instruction signal CAL and may be in logic low when the calibration instruction signal CAL is in logic high. In addition, when the calibration instruction signal CAL is input to the sensing amplifier SA, a connection between the output stage of the sensing amplifier SA and the sensing line SL may be activated, thereby allowing a voltage level of the output stage of the sensing amplifier SA to be equal to a voltage level of the sensing line SL.

The sensing amplifier SA of the memory sensing circuit may compare the sensing line voltage VSL with the non-select bias voltage VIH in response to the calibration instruction signal CAL. An output value of the sensing amplifier SA may be equal to the non-select bias voltage VIH; but when there is an offset in the sensing amplifier SA, the output value of the sensing amplifier SA may be equal to a shifted bias voltage V'IH that is shifted from the non-select bias voltage VIH by as much as the offset. Accordingly, the voltage of the sensing line SL may also be equal to the shifted bias voltage V'IH.

Figure 19:
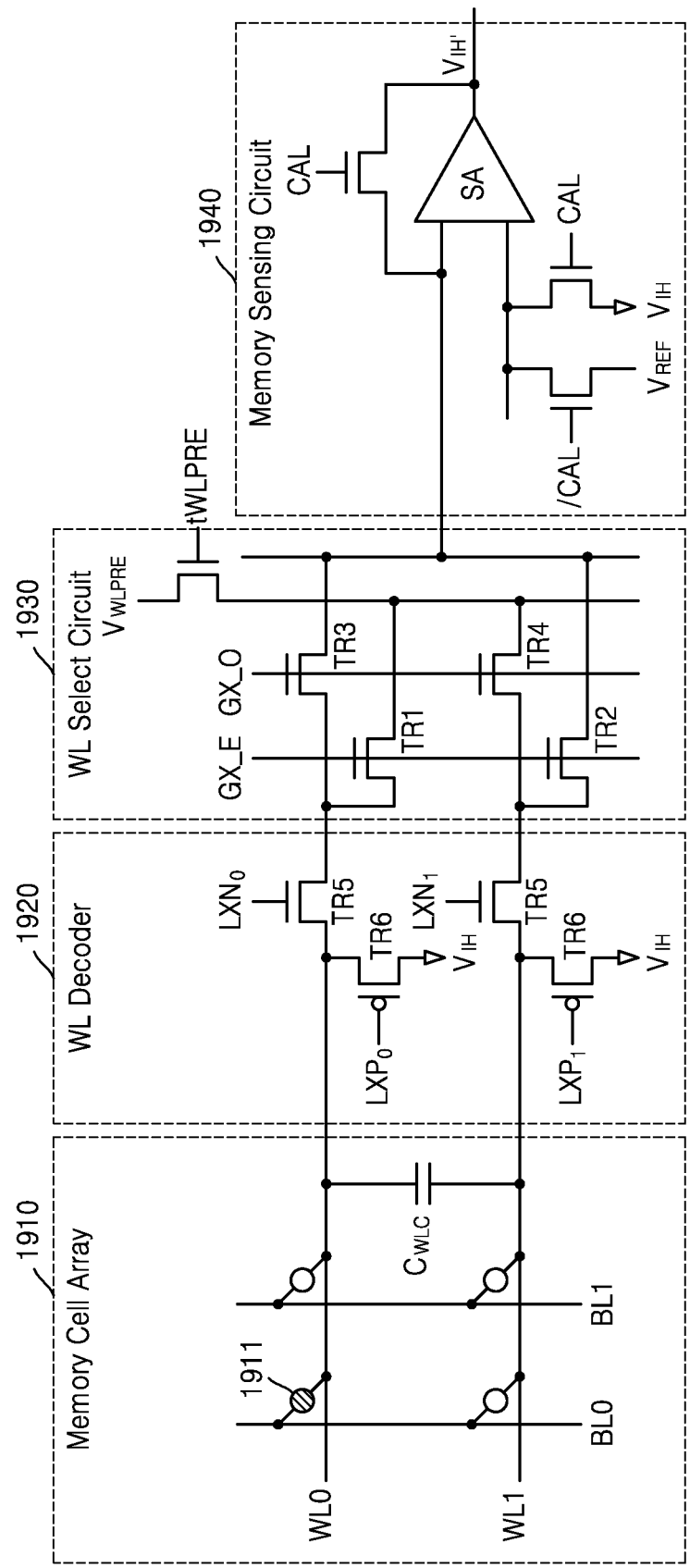
FIG. 19 is a circuit diagram illustrating a configuration of a memory device according to the embodiment of FIG. 18.

FIG. 19 illustrates a circuit with a memory sensing circuit 1940 according to the embodiment of FIG. 18 to compensate for an offset of the sensing amplifier SA substituted for the memory sensing circuit 1040 according to the circuit of FIG. 10.

Figure 20:
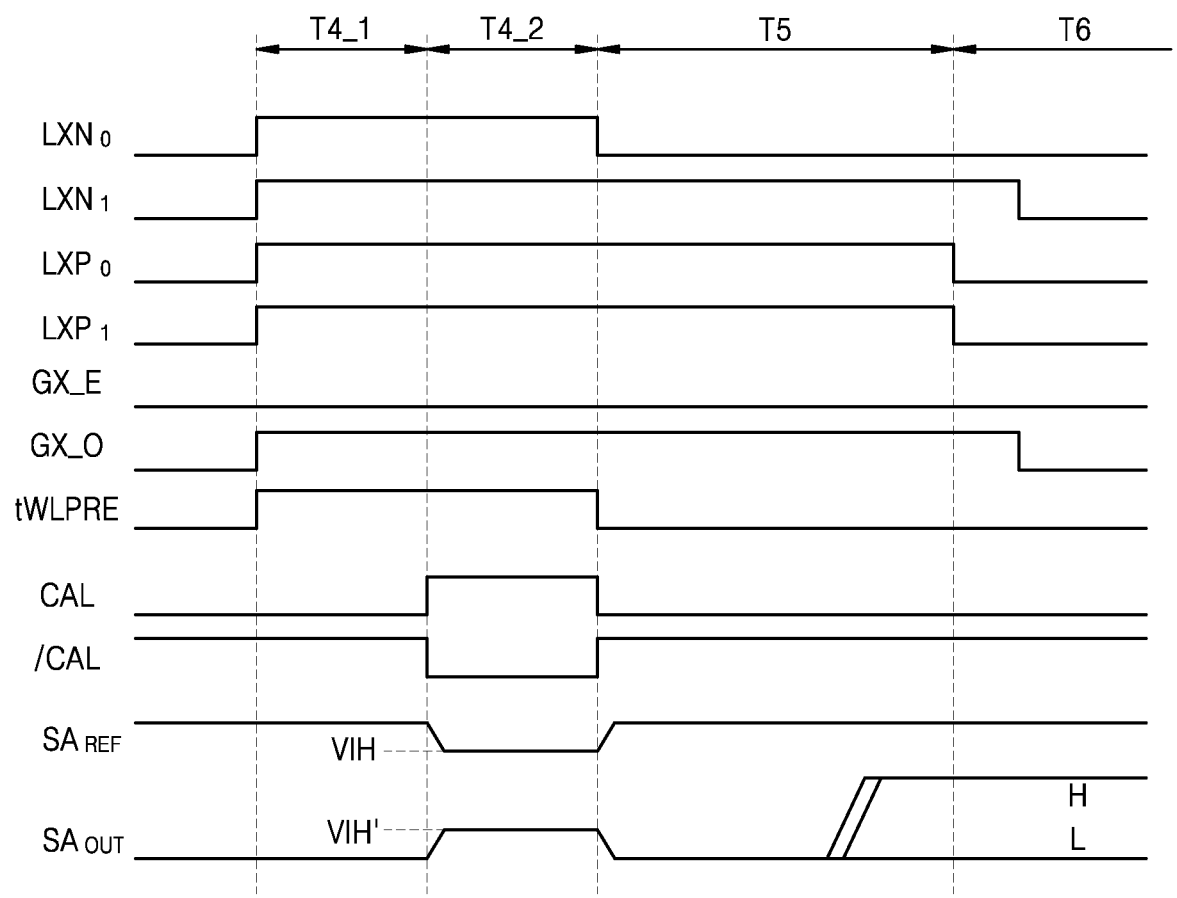
FIG. 20 is a timing diagram illustrating a readout instruction voltage of the memory device according to the embodiment of FIG. 19.

FIG. 20 illustrates operation timings obtained by adding a calibration instruction period T4_2 to the timings according to the embodiment of FIG. 11 to compensate for an offset of the sensing amplifier SA.

Figure 21:
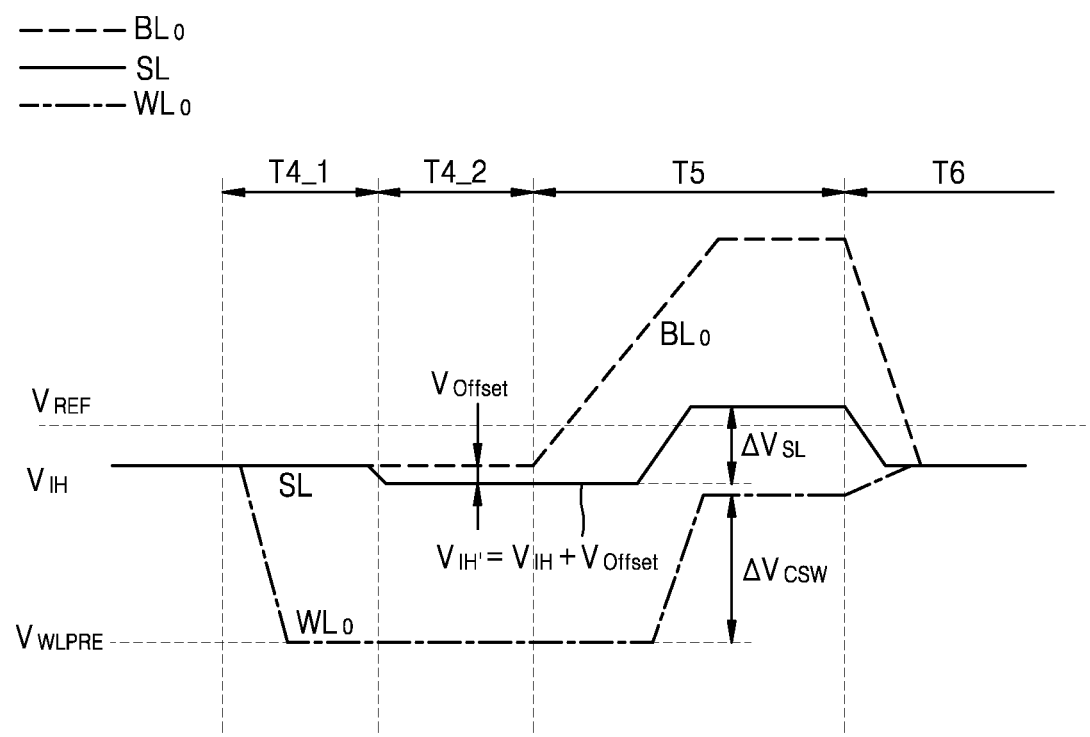
FIG. 21 is a timing diagram illustrating a voltage that is read from a target memory cell according to the embodiment of FIG. 19.

FIG. 21 illustrates that, during the calibration instruction period T4_2, voltage levels of an adjacent word-line and the sensing line SL are shifted by as much as the offset.

Because input signals according to FIG. 20 may be the same as the input signals according to the embodiment of FIG. 11 in terms of a period T4_1, the fifth period T5, and the sixth period T6, the period T4_1 being obtained by subtracting the calibration instruction period T4_2 from the fourth period T4, repeated descriptions thereof are omitted. During the calibration instruction period T4_2, as the calibration instruction signal CAL is input to the memory sensing circuit 1940, the non-select bias voltage VIH may be applied to the second input stage of the sensing amplifier SA. In the periods except for the calibration instruction period T4_2, the inverse calibration instruction signal /CAL, which is inverse to the calibration instruction signal CAL, is applied to the memory sensing circuit 1940, and thus, the reference voltage VREF may be applied to the second input stage of the sensing amplifier SA.

When the calibration instruction signal CAL is input to the memory sensing circuit 1940, during the calibration instruction period T4_2, the memory device may perform a calibration operation for compensating for the offset of the sensing amplifier SA. When the memory device performs the calibration operation, the non-select bias voltage VIH may be applied to the second input stage of the sensing amplifier SA, and the sensing amplifier SA may output the shifted bias voltage V'IH and may provide the shifted bias voltage V'IH to the sensing line SL. Referring to FIG. 21, it can be confirmed that the shifted bias voltage V'IH, which is shifted from the non-select bias voltage VIH by as much as the offset, is applied to the sensing line SL during the calibration instruction period T4_2.

During the fifth period T5, by applying a voltage for reading the target memory cell 1911 to a target bit-line BL0, a voltage of a target word-line WL0 may increase, and the voltage of the sensing line SL may increase in proportion to a voltage change $\Delta$VCSW of the target word-line WL0. Here, the voltage of the sensing line SL may increase from the shifted bias voltage V'IH by as much as a voltage change $\Delta$VSL of the sensing line SL, and when the calibration operation is performed, the memory sensing circuit 1940 may compare the reference voltage VREF with the voltage of the sensing line SL by reflecting the offset of the sensing amplifier SA, as compared with the case where the voltage of the sensing line SL increases from the non-select bias voltage VIH by as much as the voltage change $\Delta$VSL of the sensing line SL when the calibration operation is not performed. That is, when the memory device performs the calibration operation, because the voltage of the sensing line SL has a voltage level shifted by as much as an offset VOFFSET, a shifted reference voltage VREF of the sensing amplifier SA actually having a mismatch may be compared with the voltage of the sensing line SL, which is shifted by as much as the offset VOFFSET. FIG. 21 illustrates that, when the target memory cell 1911 is an ON-Cell, the voltage of the sensing line SL reflecting the offset VOFFSET is higher than the reference voltage VREF, and according to FIG. 20, when the voltage of the sensing line SL is higher than the reference voltage VREF, the sensing amplifier SA may output a logic-high signal as the comparison result SAOUT. On the contrary, when the target memory cell 1911 is an OFF-Cell, because the voltage of the sensing line SL is lower than the reference voltage VREF, the sensing amplifier SA may output a logic-low signal as the comparison result SAOUT.

Figure 22A:
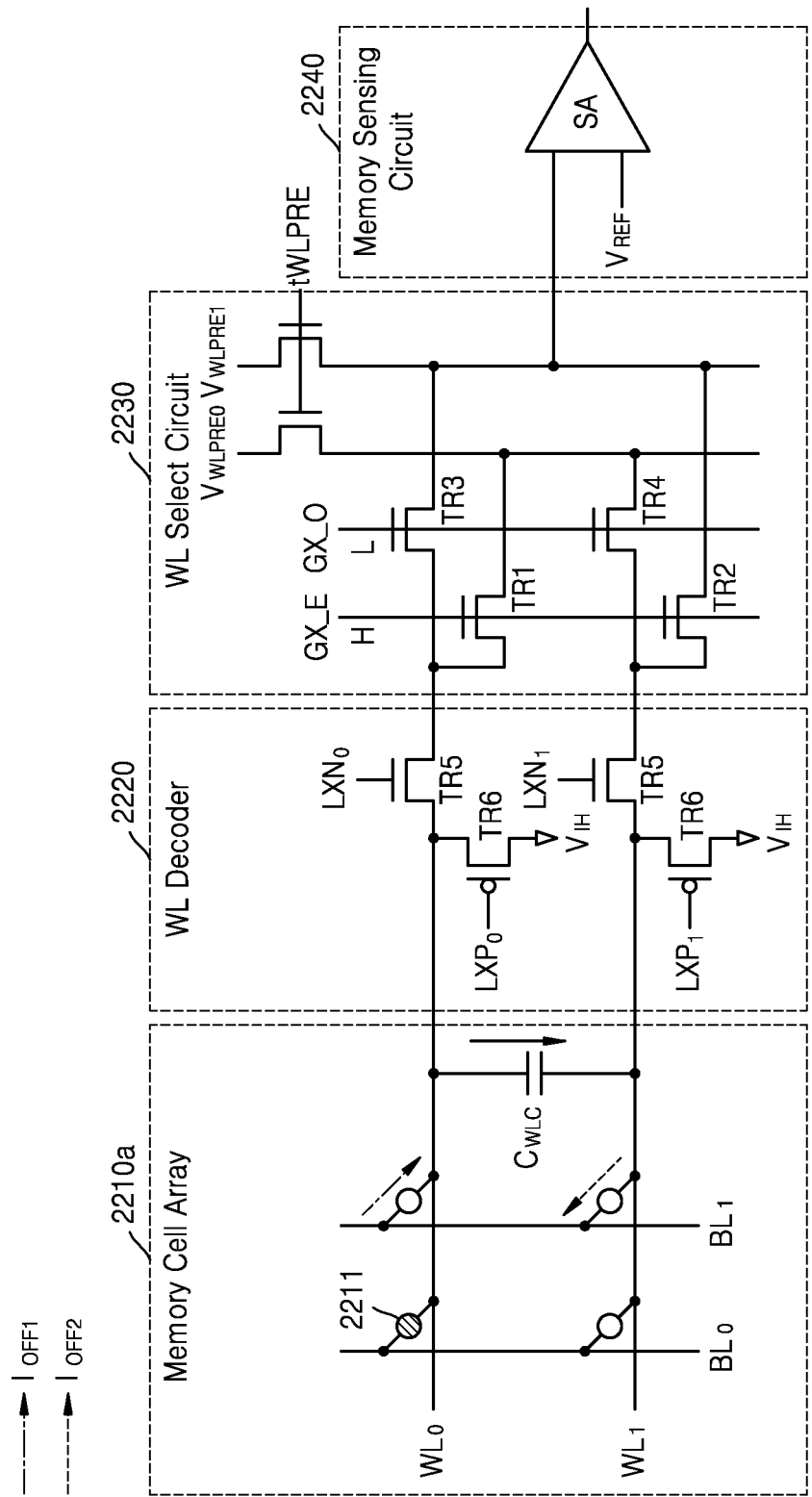
FIG. 22A is a circuit diagram illustrating a configuration for compensating for an offset of a memory cell array according to an embodiment of the inventive concept.
Figure 22B:
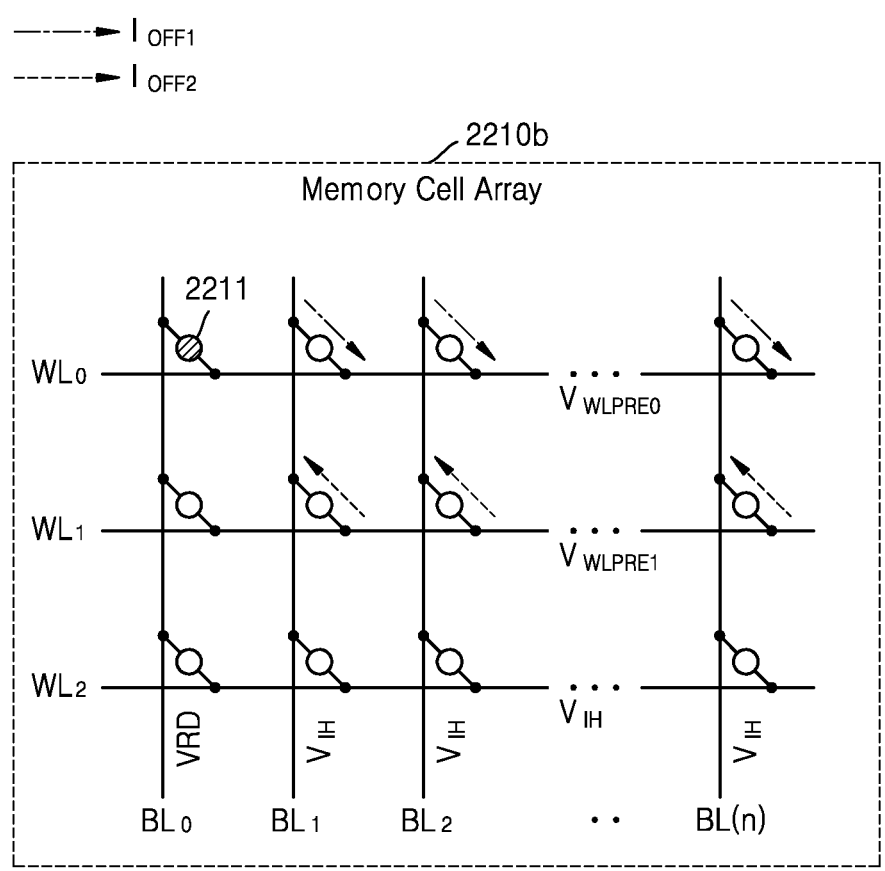
FIG. 22B is a circuit diagram illustrating a memory cell array, in which leakage currents occur in a plurality of non-selected bit-lines due to a pre-charge voltage according to an embodiment of the inventive concept.
Figure 23:
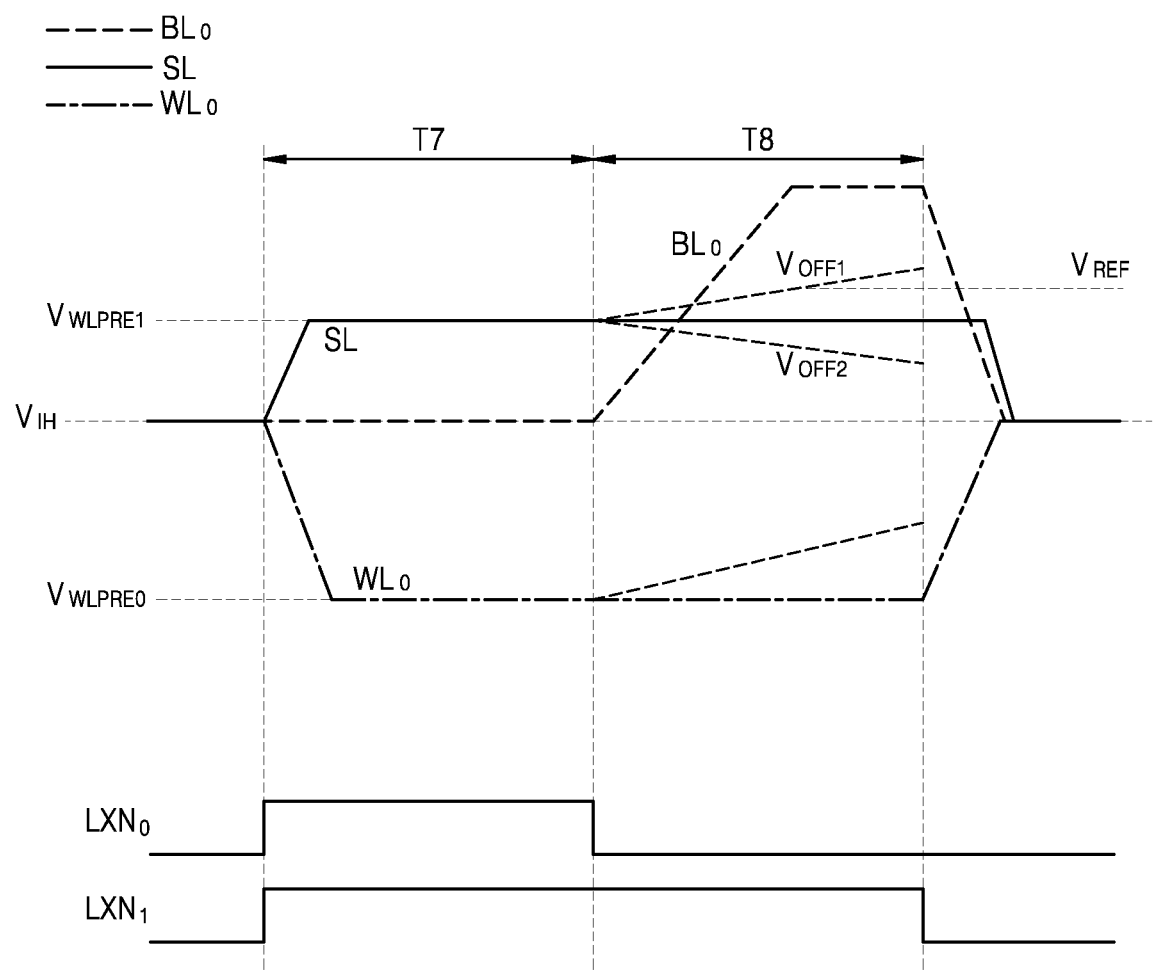
FIG. 23 is a timing diagram illustrating a readout instruction voltage of a memory device according to the embodiment of FIGS. 22A and 22B and a voltage read from a target memory cell thereof.

FIG. 22A illustrates a configuration for compensating for an offset caused by a memory cell other than a target memory cell 2211 according to an embodiment of the inventive concept, FIG. 22B illustrates that leakage currents occur in a plurality of non-selected bit-lines due to a pre-charge voltage, and FIG. 23 illustrates a readout instruction voltage of a memory device according to the embodiment of FIGS. 22A and 22B and a voltage read from the target memory cell 2211.

According to an embodiment, when the target memory cell 2211 is an OFF-Cell as in the embodiment of FIG. 23, although a voltage of the sensing line SL may theoretically be lower than the reference voltage VREF, a certain offset voltage VOFF1 may be generated due to factors such as leakage currents between word-lines and bit-lines; and thus, the voltage of the sensing line SL may actually be higher than the reference voltage VREF. Referring to FIG. 22A, when a pre-charge voltage VWLPRE0 is applied to the target word-line WL0, a leakage current due to the pre-charge voltage VWLPRE0 may occur in a memory cell connected to a non-selected bit-line BL1, and a certain voltage may be applied to the target word-line WL0.

Although FIG. 22A illustrates that the leakage current due to the pre-charge voltage VWLPRE0 occurs in one non-selected bit-line BL1 in a memory cell array 2210a, the memory device of the inventive concept is not limited thereto, and referring to a memory cell array 2210b of FIG. 22B, leakage currents due to the pre-charge voltage VWLPRE0 may also occur in a plurality of non-selected bit-lines BL1 to BLn.

The target word-line WL0 and the adjacent word-line WL1 are coupled word-lines, and the offset voltage VOFF1 may be generated in the adjacent word-line WL1 due to a certain voltage applied to the target word-line WL0. Accordingly, the memory device according to an embodiment of the inventive concept may apply, to the sensing line SL, an offset pre-charge voltage VWLPRE1 for canceling out the offset voltage VOFF1 of the adjacent word-line WL1 and the sensing line SL.

In particular, in FIGS. 22A and 22B, a leakage current may occur in a memory cell connected to the adjacent word-line WL1 and at least one non-selected bit-line (BL1 to BLn), and, as the offset pre-charge voltage VWLPRE1 for canceling out the offset voltage VOFF1, the memory device may apply a voltage in an opposite direction to that of the offset voltage VOFF1. For example, when the memory device applies the pre-charge voltage VWLPRE0 having a level lower than that of the non-select bias voltage VIH to the target word-line WL0, the pre-charge voltage VWLPRE1 having a level higher than that of the non-select bias voltage VIH may be applied to the adjacent word-line WL1 and the sensing line SL. That is, in the case of a memory cell having a bidirectional switch such as an OTS, a reverse-direction leakage current may occur in a non-selected cell connected to the target word-line WL0 and the adjacent word-line WL1, and the reverse-direction leakage current may cancel out the corresponding offset.

Figure 24:
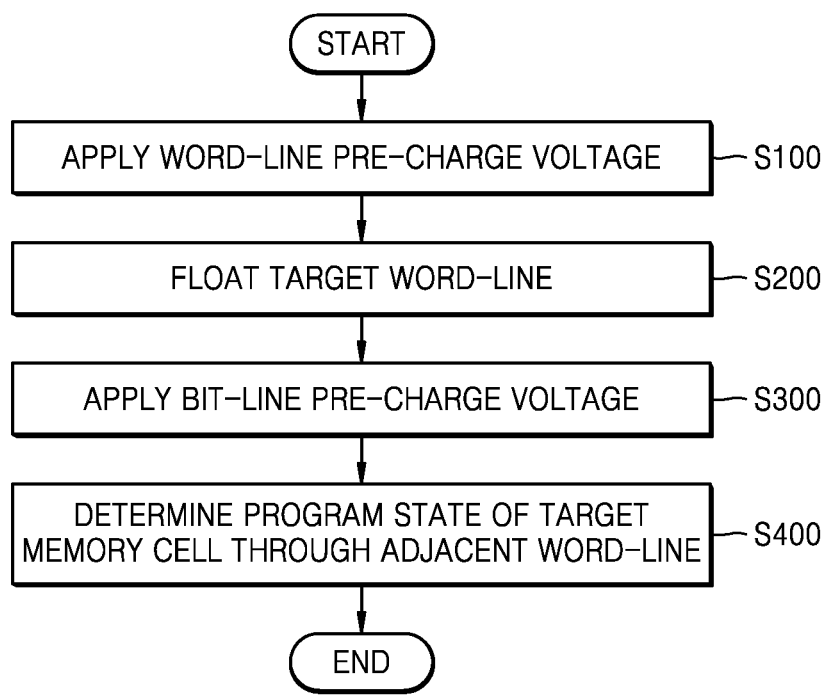
FIG. 24 is a flowchart diagram illustrating a method of operating a memory device according to an embodiment of the inventive concept.

FIG. 24 illustrates a method of operating a memory device according to an embodiment of the inventive concept.

According to an embodiment, in a method, performed by the memory device, of reading a target memory cell, a control logic of the memory device may determine voltages applied to a word-line decoder, a word-line select circuit, and a memory sensing circuit. However, the memory device of the inventive concept is not limited thereto, and the memory device may receive signals applied thereto by an external controller device and may perform each operation in response to the applied signals.

In operation S100, the memory device may apply a word-line pre-charge voltage to a target word-line in response to a first global word-line select signal and a first local word-line select signal. According to an embodiment, the first global word-line select signal may be a signal for giving an instruction to apply a pre-charge voltage to a first word-line group including the target word-line, and the first local word-line select signal may be a signal for giving an instruction to apply the pre-charge voltage to just the target word-line out of the first word-line group.

In operation S200, the memory device may float the target word-line in response to a change in a logic state of the first local word-line select signal. For example, the first local word-line select signal is changed to logic low while the pre-charge voltage is applied to the target word-line, whereby the memory device may inactivate a connection between the target word-line and the word-line select circuit.

In operation S300, the memory device may apply a bit-line pre-charge voltage to a target bit-line in response to a bit-line select signal. The bit-line pre-charge voltage is a voltage having a sign opposite to that of the word-line pre-charge voltage, and a voltage difference between the target bit-line and the target word-line increases by applying the bit-line pre-charge voltage to the target bit-line.

In operation S400, the memory device may determine a program state of a target memory cell through at least one adjacent word-line that is adjacent to the target word-line. The adjacent word-line is adjacent to and coupled to the target word-line, and thus, when a voltage occurs in the target word-line, a voltage may also occur in the adjacent word-line due to a parasitic capacitor. Accordingly, when a voltage occurs in the target word-line because the target memory cell is an ON-Cell, a certain voltage may also occur in the adjacent word-line, and the memory device may determine the program state of the target memory cell by comparing a level of the voltage generated in the adjacent word-line with a reference level.

While the inventive concept has been particularly shown and described with reference to embodiments thereof, it will be understood that various changes in form and details may be made therein without departing from the spirit and scope of the following claims.

What is claimed is:

1. A nonvolatile memory device comprising:
 a memory cell array including a plurality of memory cells arranged at intersections between a plurality of substantially parallel word-lines and a plurality of bit-lines; and
 a word-line select circuit including a plurality of first transistors each having a first terminal connected to a respective one of the plurality of word-lines, and a plurality of second transistors each having a first terminal connected to the respective one of the plurality of word-lines, wherein each of the plurality of first transistors has a second terminal connected to a pre-select line, and each of the plurality of second transistors has a second terminal connected to a sensing line, wherein at least one of the plurality of first transistors having a first terminal connected to a respective word-line of the plurality of word-lines has a control terminal connected to a control terminal of at least one of the plurality of second transistors having a first terminal connected to an adjacent word-line of the plurality of word-lines, respectively.

2. The nonvolatile memory device of claim 1, wherein:
the control terminal of the at least one of the plurality of first transistors having a first terminal connected to a respective word-line of the plurality of word-lines is connected to a first global word-line select signal line, and
the control terminal of at least one of the plurality of second transistors having a first terminal connected to a respective word-line of the plurality of word-lines is connected to a second global word-line select signal line different from the first global word-line select signal line.

3. The nonvolatile memory device of claim 1 configured to, in response to a first global word-line select signal, start reading a target memory cell connected to a target word-line and provide a reading result of the target memory cell to a sensing line through at least one adjacent word-line that is adjacent to and coupled to the target word-line.

4. The nonvolatile memory device of claim 1, wherein the word-line select circuit is configured to start reading the target memory cell by applying a pre-charge voltage to the target word-line in response to the first global word-line select signal.

5. The nonvolatile memory device of claim 1, wherein a voltage of the at least one adjacent word-line is determined by a parasitic capacitor between the target word-line and the at least one adjacent word-line.

6. The nonvolatile memory device of claim 1, further comprising a memory sensing circuit, wherein:
the memory cell array comprises a first capacitor connected to the target word-line,
the memory sensing circuit comprises a second capacitor connected to the sensing line, and
a voltage of the sensing line is determined by a capacitance ratio of the first capacitor to the second capacitor.

7. The nonvolatile memory device of claim 1, wherein the word-line select circuit is further configured to:
start reading a memory cell connected to the at least one adjacent word-line in response to a second global word-line select signal that is different from the first global word-line select signal; and
activate a connection between the target word-line and the sensing line.

8. The nonvolatile memory device of claim 1, further comprising a word-line decoder configured to determine whether to connect the target word-line and the at least one adjacent word-line to the word-line select circuit, in response to one of a local word-line select signal and a local word-line non-select signal, which are independently applied to the target word-line and the at least one adjacent word-line.

9. The nonvolatile memory device of claim 1, further comprising a memory sensing circuit configured to determine a program state of the target memory cell, based on a result of a comparison between a voltage of the sensing line and a reference voltage, wherein the memory sensing circuit is further configured to compensate for an offset of the memory sensing circuit by feeding back the offset of the memory sensing circuit to the at least one adjacent word-line in response to a calibration instruction signal, wherein the memory sensing circuit is further configured to compare the voltage of the sensing line with a non-select bias voltage in response to the calibration instruction signal; and store a comparison result as the offset in a parasitic capacitor between the target word-line and the at least one adjacent word-line.

10. A nonvolatile memory device comprising:
a memory cell array including a plurality of memory cells arranged at intersections between a plurality of word-lines and a plurality of bit-lines; and
a word-line select circuit configured to, in response to a plurality of global word-line select signals that are different from each other, determine whether to start reading a target memory cell connected to a target word-line and whether to apply a voltage of the target word-line to a sensing line.

11. The nonvolatile memory device of claim 10, wherein the memory cell array comprises:
a first word-line group comprising the target word-line; and
a second word-line group that is different from the first word-line group, and wherein the word-line select circuit comprises:
a first transistor group configured to form a first current path for the first word-line group in response to a first global word-line select signal; and
a second transistor group configured to form a second current path for the second word-line group in response to the first global word-line select signal.

12. The nonvolatile memory device of claim 11, wherein the word-line select circuit further comprises:
a third transistor group configured to form a third current path for the first word-line group in response to a second global word-line select signal; and
a fourth transistor group configured to form a fourth current path for the second word-line group in response to the second global word-line select signal.

13. The nonvolatile memory device of claim 12, wherein:
the first current path comprises a current path for giving an instruction to start reading at least one word-line from among the first word-line group,
the second current path comprises a current path for applying a current of at least one word-line from among the second word-line group to the sensing line,
the third current path comprises a current path for applying a current of at least one word-line from among the first word-line group to the sensing line, and
the fourth current path comprises a current path for giving an instruction to start reading at least one word-line from among the second word-line group.

14. The nonvolatile memory device of claim 13, wherein the word-line select circuit is configured to:
in response to the first global word-line select signal, start reading a target memory cell connected to the target word-line by forming the first current path; and
provide a reading result of the target memory cell to the sensing line by forming the second current path for at least one adjacent word-line from among the second word-line group, the at least one adjacent word-line being adjacent to and coupled to the target word-line.

15. The nonvolatile memory device of claim 14, further comprising a memory sensing circuit configured to determine a program state of the target memory cell, based on a result of a comparison between a voltage of the sensing line and a reference voltage.

16. The nonvolatile memory device of claim 15, wherein the memory sensing circuit is further configured to compensate for an offset of the memory sensing circuit by feeding back the offset of the memory sensing circuit to the at least one adjacent word-line in response to a calibration instruction signal.

17. The nonvolatile memory device of claim 14, further comprising a word-line decoder configured to determine whether to connect each word-line to the word-line select circuit, in response to one of a local word-line select signal and a local word-line non-select signal, which are independently applied to the plurality of word-lines.

18. The nonvolatile memory device of claim 17, wherein the word-line decoder comprises:
 a fifth transistor group connected to each of the plurality of word-lines and configured to determine whether to connect each word-line to the word-line select circuit, in response to one of the local word-line select signal and the local word-line non-select signal; and
 a sixth transistor group configured to determine whether to apply a non-select bias voltage to each word-line, in response to one of the local word-line select signal and the local word-line non-select signal.

19. A method of operating a nonvolatile memory device to read a target memory cell connected to a target word-line and a target bit-line, the method comprising:
 applying a word-line pre-charge voltage to the target word-line, in response to a first global word-line select signal and a first local word-line select signal;
 floating the target word-line, in response to a change in a logic state of the first local word-line select signal;
 applying a bit-line pre-charge voltage to the target bit-line, in response to a bit-line select signal; and
 determining a program state of the target memory cell through at least one adjacent word-line that is adjacent to the target word-line.

20. The method of claim 19, further comprising providing a reading result of the target memory cell to a sensing line through the at least one adjacent word-line, in response to the first global word-line select signal and a second local word-line select signal.

* * * * *